US011646823B2

(12) United States Patent
Chen et al.

(10) Patent No.: US 11,646,823 B2
(45) Date of Patent: May 9, 2023

(54) POLAR CODED HARQ-IR SCHEME

(71) Applicant: QUALCOMM Incorporated, San Diego, CA (US)

(72) Inventors: Kai Chen, Shenzhen (CN); Liangming Wu, Beijing (CN); Changlong Xu, Beijing (CN); Jian Li, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 16/960,494

(22) PCT Filed: Feb. 6, 2019

(86) PCT No.: PCT/CN2019/074728
§ 371 (c)(1),
(2) Date: Jul. 7, 2020

(87) PCT Pub. No.: WO2019/154399
PCT Pub. Date: Aug. 15, 2019

(65) Prior Publication Data
US 2021/0067269 A1     Mar. 4, 2021

(30) Foreign Application Priority Data
Feb. 9, 2018 (WO) ................ PCT/CN2018/075950

(51) Int. Cl.
*H04L 1/00* (2006.01)
*H03M 13/00* (2006.01)
(52) U.S. Cl.
CPC .......... *H04L 1/0073* (2013.01); *H04L 1/0057* (2013.01); *H04L 1/0061* (2013.01)

(58) Field of Classification Search
CPC ... H04L 1/0073; H04L 1/0057; H04L 1/0061; H03M 13/00
See application file for complete search history.

(56) References Cited

U.S. PATENT DOCUMENTS 3,028,217 A1    9/2011  Pietraski et al.
10,361,717 B2 *  7/2019  Ge ....................... H03M 13/13
(Continued)

FOREIGN PATENT DOCUMENTS

CN    101714948 A    5/2010
CN    102916763 A    2/2013
(Continued)

OTHER PUBLICATIONS

Intel Corporation: "Remaining issues for Polar code construction," 3GPP Draft; R1-1717407, 3rd Generation Partnership Project (3GPP), Mobile Competence Centre; 650, Route Des Lucioles; F-06921 Sophia-Antipolis Cedex; France, vol. RAN WG1, no. Prague, CZ; Oct. 9, 2017-Oct. 13, 2017, Oct. 8, 2017 (Oct. 8, 2017), XP051340596, 7 Pages, Retrieved from the Internet: URL:http://www.3gpp.org/ftp/Meetings_3GPP_SYNC/RAN1/Docs/ [retrieved on Oct. 8, 2017].
(Continued)

*Primary Examiner* — Justin R Knapp
(74) *Attorney, Agent, or Firm* — Arent Fox, LLP

(57) ABSTRACT

A method, apparatus, and computer-readable medium for transmitting coded messages to a receiving device including constructing a data vector including a plurality of data bits, transforming the data vector into a u-domain vector, applying a mask to the u-domain vector, encoding the masked u-domain vector with polar encoding to generate a transmission vector, and transmitting, to the receiving device, the transmission vector.

24 Claims, 30 Drawing Sheets

(56) References Cited

U.S. PATENT DOCUMENTS

| | | | |
|---|---|---|---|
| 10,778,370 B2 * | 9/2020 | Sarkis | ............... H04L 1/0057 |
| 11,038,624 B2 * | 6/2021 | Chen | ............... H04L 1/0071 |
| 11,063,611 B2 * | 7/2021 | Huang | ............... H04L 1/0071 |
| 2016/0380763 A1 | 12/2016 | Ahn et al. | |
| 2018/0019766 A1 | 1/2018 | Yang et al. | |
| 2020/0195276 A1 * | 6/2020 | Wu | ............... H04W 72/0446 |
| 2021/0328718 A1 | 10/2021 | Chen | |

FOREIGN PATENT DOCUMENTS

| | | |
|---|---|---|
| CN | 103281166 A | 9/2013 |
| CN | 107124188 A | 9/2017 |
| WO | 2017156773 A1 | 9/2017 |
| WO | 2017215486 A1 | 12/2017 |

OTHER PUBLICATIONS

International Search Report and Written Opinion—PCT/CN2018/075950—ISA/EPO—dated Nov. 2, 2018.

International Search Report and Written Opinion—PCT/CN2019/074728—ISA/EPO—May 6, 2019.

QUALCOMM Incorporated: "Polar HARQ", 3GPP TSG-RAN WG1 #86, 3GPP Draft; R1-166371_Polar HARQ, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 22, 2016-Aug. 26, 2016, Aug. 21, 2016 Aug. 21, 2016), 9 Pages, XP051140190, Retrieved from the Internet: URL: http://www.3gpp.org/ftp/Meetings_3GPP_SYNC/RAN1/Docs/ [retrieved on Aug. 21, 2016] the whole document.

Samsung: "UE-Specific Scrambling for Downlink Control Channels", 3GPP TSG RAN WG1 #90bis, R1-1717687, Oct. 13, 2017 (Oct. 13, 2017), pp. 1-3.

Ericsson: "Arrangement of PBCH Fields for Polar Codes", 3GPP TSG RAN WG1 Meeting 91, 3GPP Draft, R1-1721461 Arrangement of PBCH Fields for Polar Codes, 3rd Generation Partnership Project (3GPP), Mobile Competence Centre, 650, Route Des Lucioles, F-06921 Sophia-Antipolis Cedex, France, vol. RAN WG1, No. Reno, USA, Nov. 27, 2017-Dec. 1, 2017, Dec. 1, 2017 (Dec. 1, 2017), XP051370564, 21 Pages, Retrieved from URL: http://www.3gpp.org/ftp/tsg%5Fran/WG1%5FRL1/TSGR1%5F91/Docs/ [retrieved on Dec. 1, 2017] section 2, figure 1.

Qualcomm Incorporated: "Consideration of UE ID Scrambling for DCI", 3GPP Draft, 3GPP TSG-RAN WG1 #90-Bis, R1-1718884 Consideration of UE ID Scrambling for DCI, 3rd Generation Partnership Project (3GPP), Mobile Competence Centre, 650, Route Des Lucioles, F-06921, Sophia-Antipolis Cedex, France, vol. RAN WG1, No. Prague, Czech Republic, Oct. 9, 2017-Oct. 13, 2017, (Oct. 11, 2017), XP051353368, 11 Pages, Retrieved from URL: http://www.3gpp.org/ftp/tsg_ran/WG1_RL1/TSGR1_90b/Docs/, sections 2-4, 6, figs 1-3, sections 1, 4, figs 2-4.

Supplementary Partial European Search Report—EP19751962—Search Authority—Munich—dated Oct. 1, 2021.

Supplementary European Search Report—EP19751962—Search Authority—Munich—dated Feb. 14, 2022.

* cited by examiner $$[U_1 \ U_2 \ U_3 \ U_4 \ U_5 \ U_6 \ U_7 \ U_8] \times \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} = [X_1 \ X_2 \ X_3 \ X_4 \ X_5 \ X_6 \ X_7 \ X_8]$$

| 1 | 1 | 1 | 1 | 1 | 1 | 1 | 1 |
|---|---|---|---|---|---|---|---|
| 0 | 1 | 0 | 1 | 0 | 1 | 0 | 1 |
| 0 | 0 | 1 | 1 | 0 | 0 | 1 | 1 |
| 0 | 0 | 0 | 1 | 0 | 0 | 0 | 1 |
| 0 | 0 | 0 | 0 | 1 | 1 | 1 | 1 |
| 0 | 0 | 0 | 0 | 0 | 1 | 0 | 1 |
| 0 | 0 | 0 | 0 | 0 | 0 | 1 | 1 |
| 0 | 0 | 0 | 0 | 0 | 0 | 0 | 1 |

*FIG. 8*

POLAR CODED HARQ-IR SCHEME

CROSS REFERENCE TO RELATED APPLICATIONS

The present application is a National Phase of International Patent Application No. PCT/CN2019/074728, filed on Feb. 6, 2019, which claims priority to PCT Application Number PCT/CN2018/075950, filed on Feb. 9, 2018, entitled "POLAR CODED HARQ-IR SCHEME", the content of which is incorporated by reference in its entirety.

BACKGROUND

The present disclosure relates to wireless communications, and more particularly, to polar encoding masked messages.

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

These multiple access technologies have been adopted in various telecommunication standards to provide a common protocol that enables different wireless devices to communicate on a municipal, national, regional, and even global level. For example, 5G NR (new radio) communications technology is envisaged to expand and support diverse usage scenarios and applications with respect to current mobile network generations. In an aspect, 5G communications technology includes enhanced mobile broadband addressing human-centric use cases for access to multimedia content, services and data; ultra-reliable-low latency communications (URLLC) with requirements, especially in terms of latency and reliability; and massive machine type communications for a very large number of connected devices, and typically transmitting a relatively low volume of non-delay-sensitive information. However, as the demand for mobile broadband access continues to increase, there exists a need for further improvements in 5G communications technology and beyond. Preferably, these improvements should be applicable to other multi-access technologies and the telecommunication standards that employ these technologies.

In 5G communications, data sent by a transmitting device may not be accurately received by the receiving device. While the transmitting device may resend the entire data repeatedly until proper reception, this wastes network resources. Further, excessive retransmission may lower the overall data transmission rate of the network, which causes user equipment (UE) within the network to suffer performance degradation. Therefore, improvements in the transmission reliability may be desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In some aspects, a method for transmitting coded messages to a receiving device includes constructing a data vector including a plurality of data bits, transforming the data vector into a u-domain vector, applying a mask to the u-domain vector, encoding the masked u-domain vector with polar encoding to generate a transmission vector, and transmitting, to the receiving device, the transmission vector.

In another aspect, a user equipment for transmitting coded messages includes a memory, a transceiver, and a processor configured in communication with the memory and the transceiver and configured to construct a data vector including a plurality of data bits, transform the data vector into a u-domain vector, apply a mask to the u-domain vector, encode the masked u-domain vector with polar encoding to generate a transmission vector, and transmit, to a receiving device via the transceiver, the transmission vector.

In certain aspects, a computer-readable medium for transmitting coded messages may include instructions that cause one or more processors to construct a data vector including a plurality of data bits, transform the data vector into a u-domain vector, apply a mask to the u-domain vector, encode the masked u-domain vector with polar encoding to generate a transmission vector, and transmit the transmission vector.

In other aspects, a method, apparatus, and computer-readable medium for transmitting coded messages to a receiving device include generating a first data vector having a plurality of data bits, generating a first u-domain vector by transforming the first data vector, wherein the first u-domain vector includes first active bits and first non-active bits, encoding the first u-domain vector with a polar encoder to generate a first transmission vector having a first plurality of bits and a second plurality of bits, transmitting the first plurality of bits, receiving an indication of a failed decoding of the first plurality of bits, in response to the indication of the failed decoding: generating a second data vector having a portion of the plurality of data bits, generating a mask based on the first data vector, generating a second u-domain vector by transforming the second data vector, wherein the second u-domain vector includes second active bits and second non-active bits, applying a mask to the second u-domain vector to generate an intermediate vector, encoding the intermediate vector with the polar encoder to generate a second transmission vector having a third plurality of bits and a fourth plurality of bits, and transmitting the third plurality of bits.

In another aspect, a user equipment for transmitting coded messages includes a memory, a transceiver, and a processor configured in communication with the memory and the transceiver and configured to generate a first data vector having a plurality of data bits, generate a first u-domain vector by transforming the first data vector, wherein the first u-domain vector includes first active bits and first non-active bits, encode the first u-domain vector with a polar encoder to generate a first transmission vector having a first plurality of bits and a second plurality of bits, transmit, via the transceiver, the first plurality of bits, receive an indication of a failed decoding of the first plurality of bits, in response to the indication of the failed decoding: generating a second data vector having a portion of the plurality of data bits, generating a mask based on the first data vector, generating a second u-domain vector by transforming the second data vector, wherein the second u-domain vector includes second active bits and second non-active bits, apply a mask to the second u-domain vector to generate an intermediate vector, encode the intermediate vector with the polar encoder to generate a second transmission vector having a third plurality of bits and a fourth plurality of bits, and transmit, via the transceiver, the third plurality of bits.

In certain aspects, a computer-readable medium for transmitting coded messages may include instructions that cause one or more processors to generate a first data vector having a plurality of data bits, generate a first u-domain vector by transforming the first data vector, wherein the first u-domain vector includes first active bits and first non-active bits, encode the first u-domain vector with a polar encoder to generate a first transmission vector having a first plurality of bits and a second plurality of bits, transmit the first plurality of bits, receive an indication of a failed decoding of the first plurality of bits, in response to the indication of the failed decoding: generating a second data vector having a portion of the plurality of data bits, generating a mask based on the first data vector, generating a second u-domain vector by transforming the second data vector, wherein the second u-domain vector includes second active bits and second non-active bits, apply a mask to the second u-domain vector to generate an intermediate vector, encode the intermediate vector with the polar encoder to generate a second transmission vector having a third plurality of bits and a fourth plurality of bits, and transmit the third plurality of bits.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which:

FIG. 3 is an example of rate-matching under shorten mode in hybrid automatic repeat request (hybrid ARQ or HARQ);

FIG. 8 is an example of a matrix for generating masks for the u-domain vectors;

DETAILED DESCRIPTION

Figure 1:
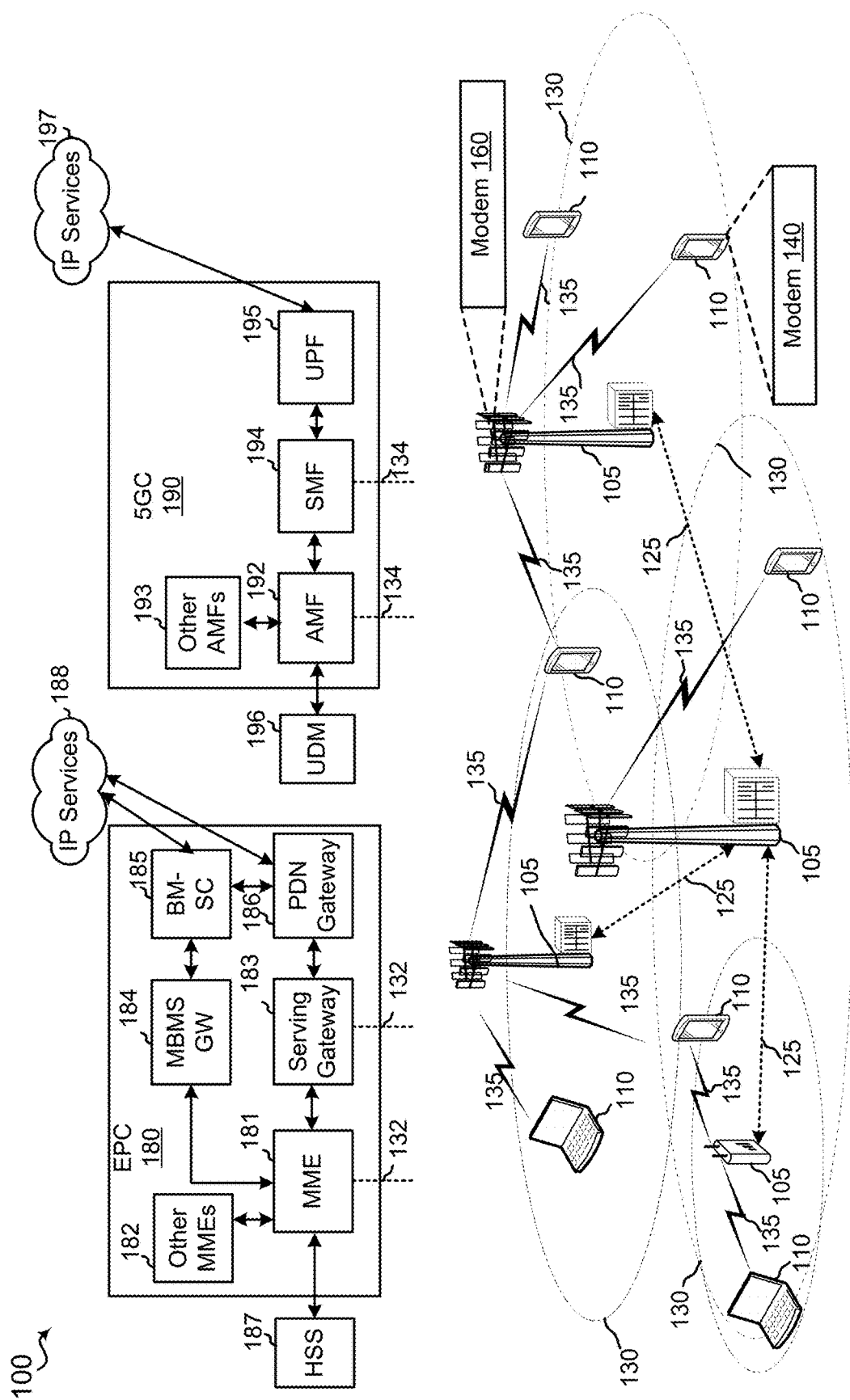
FIG. 1 is a schematic diagram of an example of a wireless communication network including at least one user equipment.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium, such as a computer storage media. Storage media may be any available media that may be accessed by a computer. By way of example, and not limitation, such computer-readable media may comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

It should be noted that the techniques described herein may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 902.11 (Wi-Fi), IEEE 902.16 (WiMAX), IEEE 902.20, Flash-OFDM™, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description below, however, describes an LTE/LTE-A and/or 5G New Radio (NR) system for purposes of example, and LTE or 5G NR terminology is used in much of the description below, although the techniques are applicable beyond LTE/LTE-A and 5G NR applications, e.g., to other next generation communication systems).

In some implementations, a transmitting device of data may use polar code to encode the data information prior to transmission. Polar code may select the most reliable transmission location after channel polarization transform and carry data bits on the most reliable transmission location. After rate-matching, polar code may work under the puncture mode, the shorten mode, and the repetition mode. Polar code, in some examples, may be used for hybrid automatic repeat request chase combining (HARQ-CC) or HARQ incremental redundancy (HARQ-IR). During HARQ-CC, the transmitting device transmits the same codeword at each re-transmission, with no coding gain at the retransmissions. During HARQ-IR, the transmitting device incrementally transmits parts of a long codeword at each retransmission, and may obtain additional coding gain after every retransmission. HARQ-CC may be easier to implement, while HARQ-IR may be more complex to decode and require a buffer at the receiving device.

In certain aspects, a mask may be applied to a data vector to relocate data bits for subsequent retransmissions in a communication system that utilizes the HARQ-IR scheme for redundancy. After the initial transmission, the communication system may receive a feedback message indicating the quality of transmission. The communication system may relocate data bits toward more reliable channels for subsequent resources by applying a mask prior to the polar encoding. The masking process may place certain data bits (i.e. ones that failed to be decoded by the receiving device) in more reliable communication channels for retransmission.

Active bit relocation using u-domain mask (ARUM) allows each transmission to have an independent encoding and rate-matching scheme. ARUM works with various rate-matching schemes and may obtain additional coding gains. The transmissions may be self-decodable. The process of masking the u-domain vectors may adhere to channel polarization transform rules and obtain desirable coding gains of polar code. In some implementations, the loss may be less than 0.2 decibel compared with theoretical transmission limit.

Referring to FIG. 1, in accordance with various aspects of the present disclosure, the wireless communication network 100 may include one or more base stations (BSs) 105, one or more UEs 110, and a core network, such as an Evolved Packet Core (EPC) 180 or a 5G core (5GC) 190. The BS 105 may include a number of components (shown in FIG. 27) to implement features of the present disclosure. For example, a data component 170 within a modem 160 of the BS 105 may generate data vectors from data bits used in communicating with the UEs 110. The data vectors may contain textual, audio, and/or video information sent by the BS 105 to the UEs 110. A masking component 172 may mask the data vectors to relocate portions of the data bits within the data vectors from one resource location to another. An encoding component 174 may apply polar encoding to the data vectors to transform the data vectors into codewords for transmission, and decode polar encoded codewords back to data vectors. A communication component 176 of the BS 105 may send and receive codewords to/from UEs 110. A decoding component 178 may decode polar-coded messages received by the BS 105.

Similarly, the UE 110 may include a number of components (shown in FIG. 26) to implement features of the present disclosure. For example, a data component 150 within a modem 140 of the UE 110 may generate data vectors from data bits used in communicating with the BS 105. A masking component 152 may mask the data vectors to relocate portions of the data bits within the data vectors from one resource location to another. An encoding component 154 may apply polar encoding to the data vectors to transform the data vectors into codewords for transmission, and decode polar encoded codewords back to data vectors. A communication component 156 of the UE 110 may send and receive codewords to/from the BS 105. A decoding component 158 may decode polar-coded messages received by the UE 110.

The modem 160 of base station 105 may be configured to communicate with other base stations 105 and UEs 110 via a cellular network or other wireless and wired networks. The modem 140 of UE 110 may be configured to communicate via a cellular network, a Wi-Fi network, or other wireless and wired networks. The modems 140, 160 may receive and transmit data packets, via transceivers.

The EPC 180 or the 5GC 190 may provide user authentication, access authorization, tracking, internet protocol (IP) connectivity, and other access, routing, or mobility functions. The base stations 105 configured for 4G LTE (collectively referred to as Evolved Universal Mobile Telecommunications System (UMTS) Terrestrial Radio Access Network (E-UTRAN)) may interface with the EPC 180 through backhaul links 132 (e.g., S1, etc.). The base stations 105 configured for 5G NR (collectively referred to as Next Generation RAN (NG-RAN)) may interface with the 5GC 190 through backhaul links 134. In addition to other functions, the base stations 105 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 105 may communicate with each other directly or indirectly (e.g., through the EPC 180 or the 5GC 190), with one another over backhaul links 125, 132, or 134 (e.g., X1 or X2 interfaces.). The backhaul links 125, 132, 134 may be wired or wireless communication links.

The base stations 105 may wirelessly communicate with the UEs 110 via one or more base station antennas. Each of the base stations 105 may provide communication coverage for a respective geographic coverage area 130. In some examples, the base stations 105 may be referred to as a base transceiver station, a radio base station, an access point, an access node, a radio transceiver, a NodeB, eNodeB (eNB), gNB, Home NodeB, a Home eNodeB, a relay, a transceiver function, a basic service set (BSS), an extended service set (ESS), a transmit reception point (TRP), or some other suitable terminology. The geographic coverage area 130 for a base station 105 may be divided into sectors or cells making up only a portion of the coverage area (not shown). The wireless communication network 100 may include base stations 105 of different types (e.g., macro base stations or small cell base stations, described below). Additionally, the plurality of base stations 105 may operate according to different ones of a plurality of communication technologies (e.g., 5G (New Radio or "NR"), fourth generation (4G)/LTE, 3G, Wi-Fi, Bluetooth, etc.), and thus there may be overlapping geographic coverage areas 130 for different communication technologies.

In some examples, the wireless communication network 100 may be or include one or any combination of communication technologies, including a NR or 5G technology, a Long Term Evolution (LTE) or LTE-Advanced (LTE-A) or MuLTEfire technology, a Wi-Fi technology, a Bluetooth technology, or any other long or short range wireless communication technology. In LTE/LTE-A/MuLTEfire networks, the term evolved node B (eNB) may be generally used to describe the base stations 105, while the term UE may be generally used to describe the UEs 110. The wireless communication network 100 may be a heterogeneous technology network in which different types of eNBs provide coverage for various geographical regions. For example, each eNB or base station 105 may provide communication coverage for a macro cell, a small cell, or other types of cell. The term "cell" is a 3GPP term that may be used to describe a base station, a carrier or component carrier associated with a base station, or a coverage area (e.g., sector, etc.) of a carrier or base station, depending on context.

A macro cell may generally cover a relatively large geographic area (e.g., several kilometers in radius) and may allow unrestricted access by UEs 110 with service subscriptions with the network provider.

A small cell may include a relative lower transmit-powered base station, as compared with a macro cell, that may operate in the same or different frequency bands (e.g., licensed, unlicensed, etc.) as macro cells. Small cells may include pico cells, femto cells, and micro cells according to various examples. A pico cell, for example, may cover a small geographic area and may allow unrestricted access by UEs 110 with service subscriptions with the network provider. A femto cell may also cover a small geographic area (e.g., a home) and may provide restricted access and/or unrestricted access by UEs 110 having an association with the femto cell (e.g., in the restricted access case, UEs 110 in a closed subscriber group (CSG) of the base station 105, which may include UEs 110 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The communication networks that may accommodate some of the various disclosed examples may be packet-based networks that operate according to a layered protocol stack and data in the user plane may be based on the IP. A user plane protocol stack (e.g., packet data convergence protocol (PDCP), radio link control (RLC), MAC, etc.), may perform packet segmentation and reassembly to communicate over logical channels. For example, a MAC layer may perform priority handling and multiplexing of logical channels into transport channels. The MAC layer may also use HARQ to provide retransmission at the MAC layer to improve link efficiency. In the control plane, the RRC protocol layer may provide establishment, configuration, and maintenance of an RRC connection between a UE 110 and the base stations 105. The RRC protocol layer may also be used for the EPC 180 or the 5GC 190 support of radio bearers for the user plane data. At the physical (PHY) layer, the transport channels may be mapped to physical channels.

The UEs 110 may be dispersed throughout the wireless communication network 100, and each UE 110 may be stationary or mobile. A UE 110 may also include or be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 110 may be a cellular phone, a smart phone, a personal digital assistant (PDA), a wireless modem, a wireless communication device, a handheld device, a tablet computer, a laptop computer, a cordless phone, a smart watch, a wireless local loop (WLL) station, an entertainment device, a vehicular component, a customer premises equipment (CPE), or any device capable of communicating in wireless communication network 100. Some non-limiting examples of UEs 110 may include a session initiation protocol (SIP) phone, a satellite radio, a global positioning system, a multimedia device, a video device, a digital audio player (e.g., MP3 player), a camera, a game console, a smart device, a wearable device, a vehicle, an electric meter, a gas pump, a large or small kitchen appliance, a healthcare device, an implant, a sensor/actuator, a display, or any other similar functioning device. Additionally, a UE 110 may be Internet of Things (IoT) and/or machine-to-machine (M2M) type of device, e.g., a low power, low data rate (relative to a wireless phone, for example) type of device, that may in some aspects communicate infrequently with wireless communication network 100 or other UEs. Some examples of IoT devices may include parking meter, gas pump, toaster, vehicles, and heart monitor. A UE 110 may be able to communicate with various types of base stations 105 and network equipment including macro eNBs, small cell eNBs, macro gNBs, small cell gNBs, relay base stations, and the like.

A UE 110 may be configured to establish one or more wireless communication links 135 with one or more base stations 105. The wireless communication links 135 shown in wireless communication network 100 may carry uplink (UL) transmissions from a UE 110 to a base station 105, or downlink (DL) transmissions, from a base station 105 to a UE 110. The downlink transmissions may also be called forward link transmissions while the uplink transmissions may also be called reverse link transmissions. Each wireless communication link 135 may include one or more carriers, where each carrier may be a signal made up of multiple sub-carriers (e.g., waveform signals of different frequencies) modulated according to the various radio technologies described above. Each modulated signal may be sent on a different sub-carrier and may carry control information (e.g., reference signals, control channels, etc.), overhead information, user data, etc. In an aspect, the wireless communication links 135 may transmit bidirectional communications using frequency division duplex (FDD) (e.g., using paired spectrum resources) or time division duplex (TDD) operation (e.g., using unpaired spectrum resources). Frame structures may be defined for FDD (e.g., frame structure type 1) and TDD (e.g., frame structure type 2). Moreover, in some aspects, the wireless communication links 135 may represent one or more broadcast channels.

In some aspects of the wireless communication network 100, base stations 105 or UEs 110 may include multiple antennas for employing antenna diversity schemes to improve communication quality and reliability between base stations 105 and UEs 110. Additionally or alternatively, base stations 105 or UEs 110 may employ multiple input multiple output (MIMO) techniques that may take advantage of multi-path environments to transmit multiple spatial layers carrying the same or different coded data.

Wireless communication network 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 110 may be configured with multiple downlink CCs and one or more uplink CCs for carrier aggregation. Carrier aggregation may be used with both FDD and TDD component carriers. The communication links 135 may use multiple-input and multiple-output (MIMO) antenna technology, including spatial multiplexing, beamforming, and/or transmit diversity. The base stations 105 and UEs 110 may use spectrum up to Y MHz (e.g., 5, 10, 15, 20, 30, 50, 100, 200, 400, etc., MHz) bandwidth per carrier allocated in a carrier aggregation of up to a total of $Y_x$ MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 110 may communicate with each other using device-to-device (D2D) communication link 138. The D2D communication link 138 may use the DL/UL WWAN spectrum. The D2D communication link 138 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications network 100 may further include base stations 105 operating according to Wi-Fi technology, e.g., Wi-Fi access points, in communication with UEs 110 operating according to Wi-Fi technology, e.g., Wi-Fi stations (STAs) via communication links in an unlicensed frequency spectrum (e.g., 5 GHz). When communicating in an unlicensed frequency spectrum, the STAs and AP may perform a clear channel assessment (CCA) or listen before talk (LBT) procedure prior to communicating in order to determine whether the channel is available.

The small cell may operate in a licensed and/or an unlicensed frequency spectrum. When operating in an unlicensed frequency spectrum, the small cell may employ NR and use the same 5 GHz unlicensed frequency spectrum as used by the Wi-Fi AP. The small cell, employing NR in an unlicensed frequency spectrum, may boost coverage to and/or increase capacity of the access network.

A base station 105, whether a small cell or a large cell (e.g., macro base station), may include an eNB, gNodeB (gNB), or other type of base station. Some base stations 105, such as gNB 180 may operate in a traditional sub 6 GHz spectrum, in millimeter wave (mmW) frequencies and/or near mmW frequencies in communication with the relay UE 110. When the gNB 180 operates in mmW or near mmW frequencies, the gNB 180 may be referred to as an mmW base station. Extremely high frequency (EHF) is part of the radio frequency (RF) in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW and/or near mmW radio frequency band has extremely high path loss and a short range. The mmW base station 105 may utilize beamforming with the UEs 110 in their transmissions to compensate for the extremely high path loss and short range.

In a non-limiting example, the EPC 180 may include a Mobility Management Entity (MME) 181, other MMES 182, a Serving Gateway 183, a Multimedia Broadcast Multicast Service (MBMS) Gateway 184, a Broadcast Multicast Service Center (BM-SC) 185, and a Packet Data Network (PDN) Gateway 186. The MME 181 may be in communication with a Home Subscriber Server (HSS) 187. The MME 181 is the control node that processes the signaling between the UEs 110 and the EPC 180. Generally, the MME 181 provides bearer and connection management. All user Internet protocol (IP) packets are transferred through the Serving Gateway 183, which itself is connected to the PDN Gateway 186. The PDN Gateway 186 provides UE IP address allocation as well as other functions. The PDN Gateway 186 and the BM-SC 185 are connected to the IP Services 188. The IP Services 188 may include the Internet, an intranet, an IP Multimedia Subsystem (IMS), a PS Streaming Service, and/or other IP services. The BM-SC 185 may provide functions for MBMS user service provisioning and delivery. The BM-SC 185 may serve as an entry point for content provider MBMS transmission, may be used to authorize and initiate MBMS Bearer Services within a public land mobile network (PLMN), and may be used to schedule MBMS transmissions. The MBMS Gateway 184 may be used to distribute MBMS traffic to the base stations 105 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 110 and the 5GC 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

Figure 2:
FIG. 2 is an example of rate-matching under repetition mode or puncture mode in HARQ.

Referring to FIG. 2, which shows an example 200 of rate-matching under repetition mode or puncture mode in HARQ. When transmitting using the repetition mode, a data vector 210 may include active bits and non-active bits (i.e. frozen bits). A matrix 212 may transform the data vector 210 into a transmission vector 214. Some of the bits in the transmission vector 214 may be sent via the communication links 135, while other bits in the transmission vector 214 may be transmitted more than once. A receiving decoder may add the corresponding log-likelihood ratios (LLRs) of the copies of the same bits during decoding. When transmitting using the puncture mode, some of the bits in the transmission vector 214 may be sent via the communication links 135, while other bits in the transmission vector 214 may not be transmitted. A receiving decoder may set the LLRs of the bits not transmitted to zero.

Referring to FIG. 3, which shows an example 300 of rate-matching under shorten mode in HARQ. When transmitting using the puncture mode, a data vector 310 may include active bits and non-active bits, such as frozen bits and shorten bits 312. A matrix 320 may transform the data vector 310 into an transmission vector 330. Some of the bits in the transmission vector 330 may be sent via the communication links 135, while other bits in the transmission vector 330 may be zero-valued and unnecessary to transmit. A receiving decoder may set the corresponding LLRs to positive infinity because of the known zero bits. The LLR of a bit may be calculated using the formula $$LLR(b) = \log\left(\frac{P(b=0)}{P(b=1)}\right).$$

Figure 4:
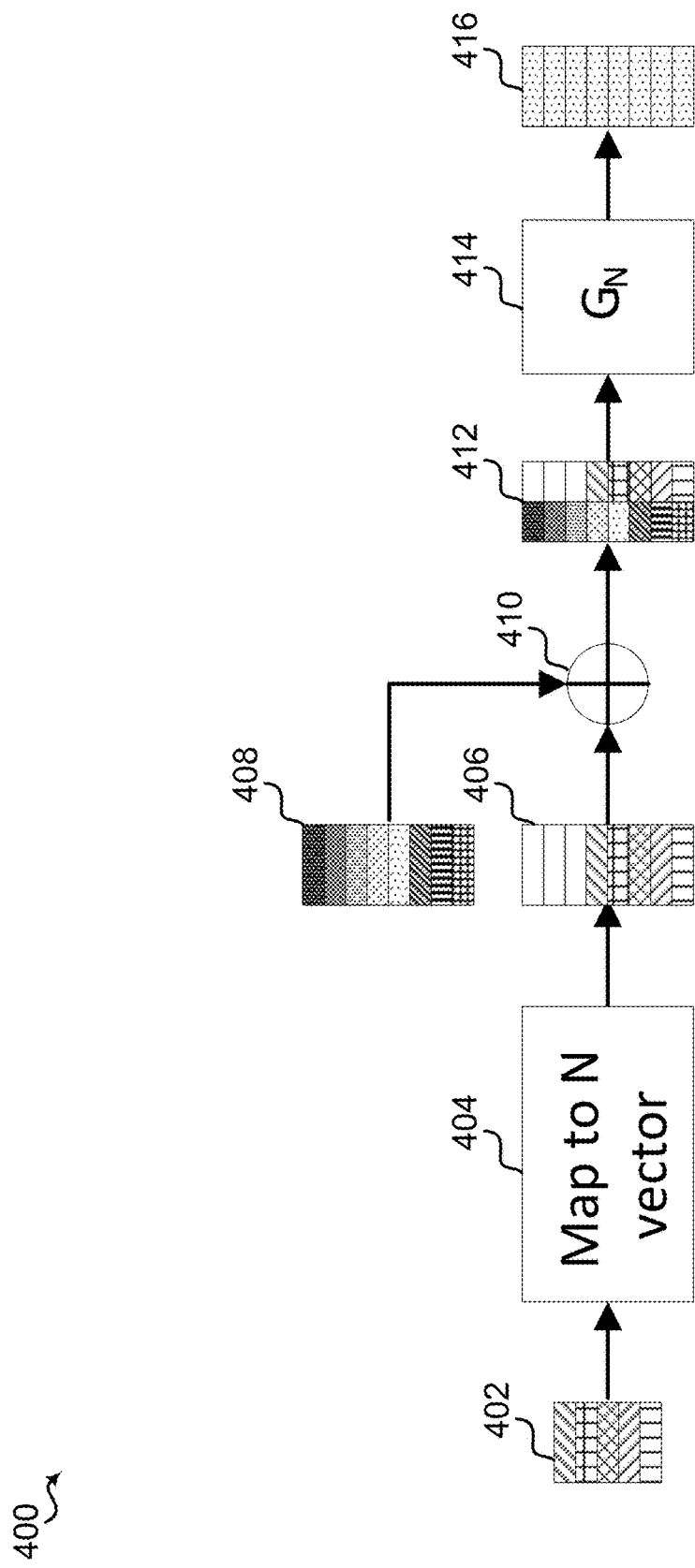
FIG. 4 is an example of a block diagram of polar encoding of masked u-domain vectors.

FIG. 4 shows an example of a block diagram 400 of polar encoding of masked u-domain vectors, or an intermediate vector. A data vector 402 may include a number of data bits. By transforming the data vector 402 with a mapping matrix 404, the data vector 402 is transformed to a u-domain vector 406. The u-domain vector 406 may be N-bit vector that results from ratematching the data vector 402. The u-domain vector 406 may include more bits than the data vector 402. A bit-wise addition 410 may be performed on the u-domain vector 406 and a masking vector 408 to create an intermediate vector 412. The bit-wise addition 410 may be a masking process that relocates one or more bits in the u-domain vector 406 from one resource location to another. For example, the masking process may relocate the one or more bits in the u-domain vector 406 from a resource location having low transmission reliability to another resource location having high transmission reliability. The intermediate vector 412 may be transformed to a transmission vector 416 by a polar encoding matrix 414. The polar encoding matrix 414 may perform a polar encoding transformation. The transmission vector 416 may be sent to a receiving device. Throughout the figures of the present application different bits may be indicated with different colors. The same information identifying the different bits may also be conveyed using different patterns.

Figure 5:
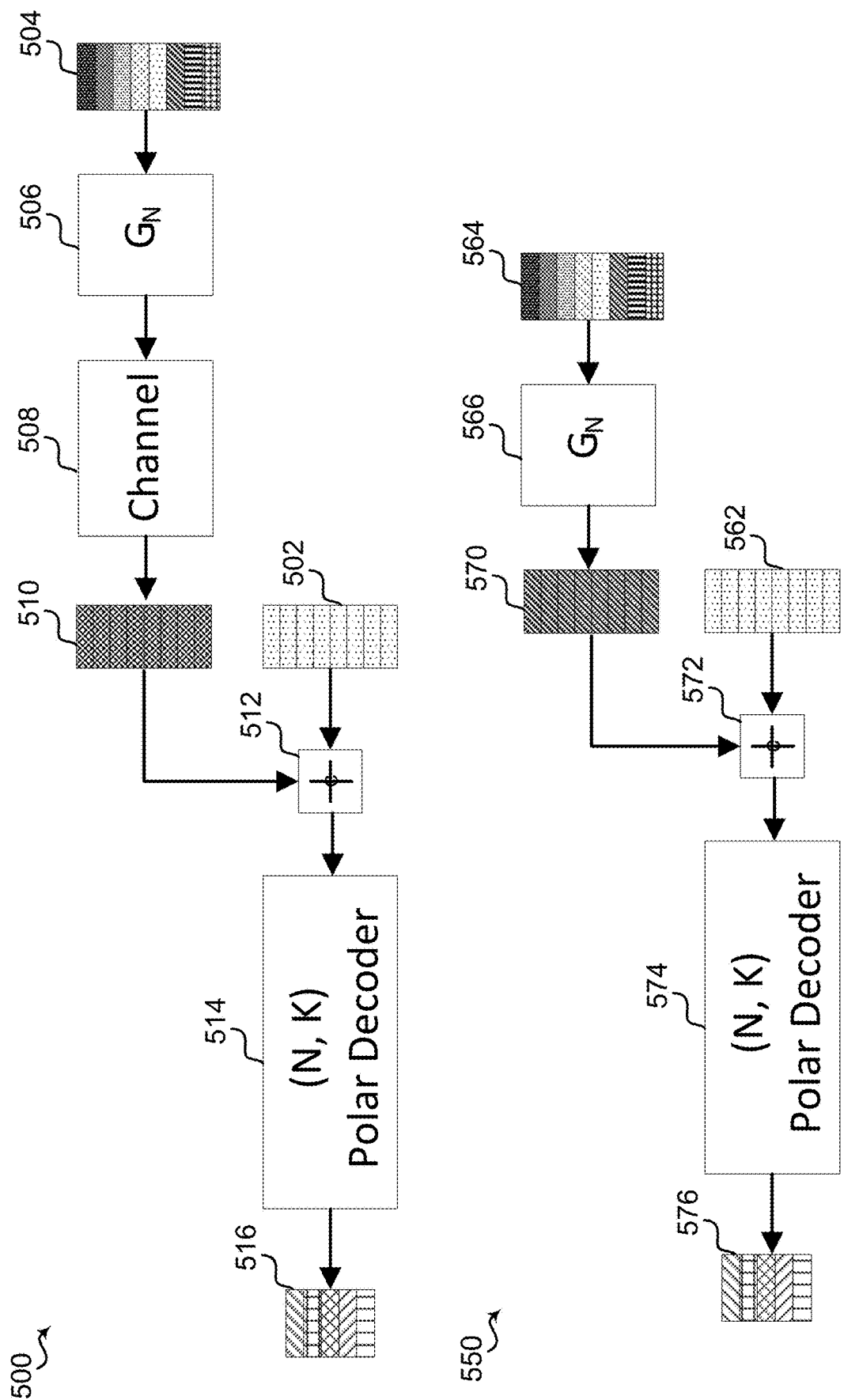
FIG. 5 is examples of block diagrams of polar decoding of transmission vectors.

FIG. 5 shows an example of a block diagram 500 of polar decoding of transmission vectors with unknown mask and an example of a block diagram 550 of polar decoding of transmission vectors with known mask. A masking vector 504 may be transformed by a polar encoding matrix 506 and transmitted across a channel 508 into a LLR mask vector 510. The receiving device may perform a LLR check 512 of a transmission vector 502 and the LLR mask vector 510. The result of the LLR check 512 is inputted into a polar decoder 514 to generate a received data vector 516. The received data vector 516 may include data bits sent by the transmitting device.

Still referring to FIG. 5, a masking vector 564 may be transformed by a polar encoding matrix 566 into a second mask vector 570. The receiving device may perform a sign flip 572 of a transmission vector 562 and the second mask vector 570. The result of the sign flip 572 is inputted into a polar decoder 574 to generate a received data vector 576. The received data vector 576 may include data bits sent by the transmitting device.

Figure 6:
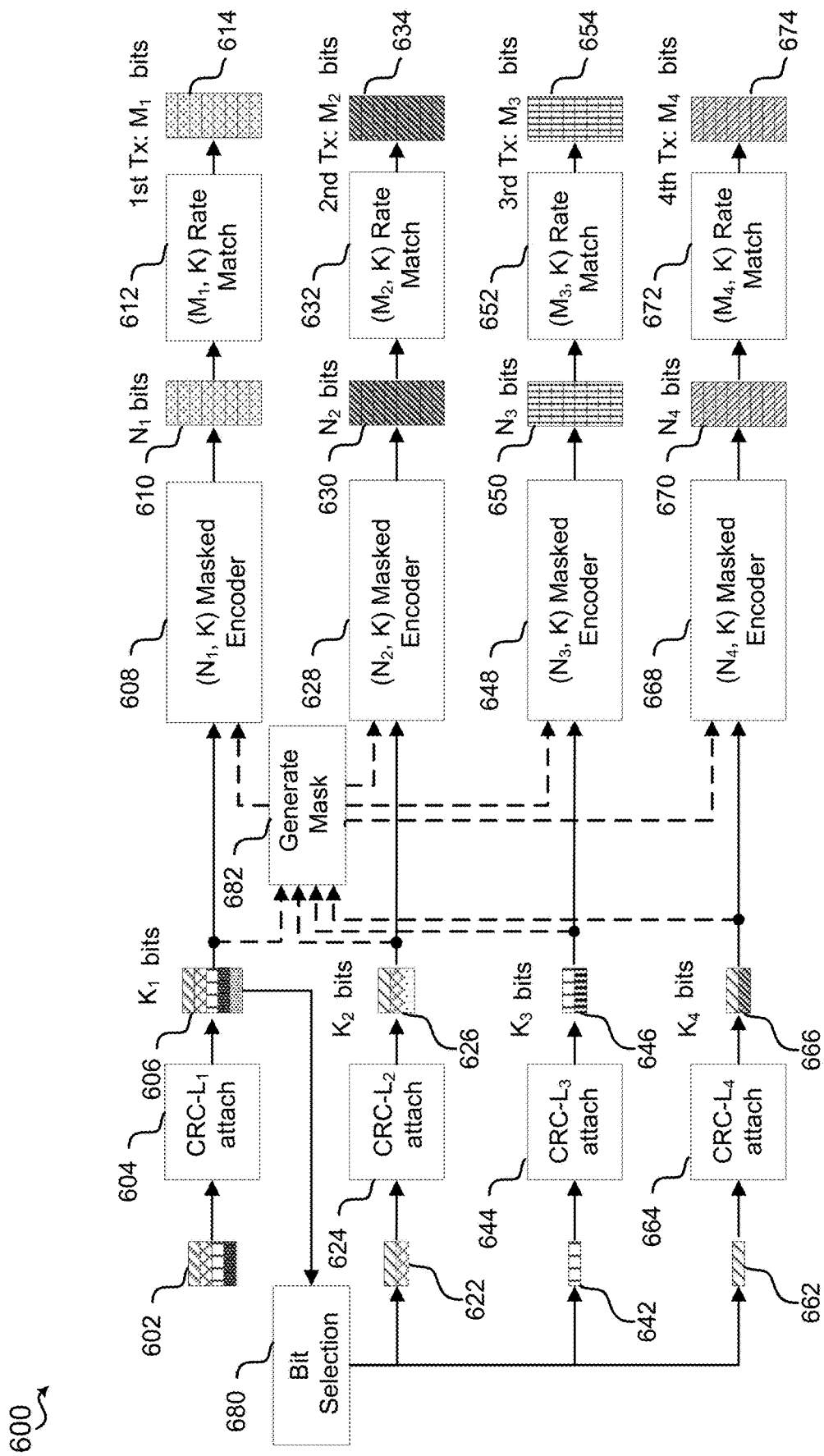
FIG. 6 is another example of a block diagram of polar encoding of masked u-domain vectors in a transmitting device

Referring now to FIG. 6, which illustrates another example of a block diagram 600 of polar encoding of masked u-domain vectors in a transmitter. In some implementations, the transmitting device attaches 604 cyclic redundancy check (CRC) bits to data bits 602 to generate a data vector 606 having $k_1$ bits. The data vector 606 is transformed by a masked encoder 608 into an intermediate vector 610 having $N_1$ bits. The intermediate vector 610 may be transformed by a rate match matrix 612 to generate a first transmission vector 614 having $M_1$ bits.

Still referring to FIG. 6, if the transmitting device receives an indication of failed decoding of some bits within the data bits 602, a bit selection 680 may be performed to select data bits 622 for a first repeated transmission. In certain implementations, the transmitting device attaches 624 CRC bits to data bits 622 to generate a data vector 626 having $k_2$ bits. The data vector 626 is transformed by a masked encoder 628 into an intermediate vector 630 having $N_2$ bits. The intermediate vector 630 may be transformed by a rate match matrix 632 to generate a second transmission vector 634 having $M_2$ bits.

Referring again to FIG. 6, if the transmitting device receives another indication of failed decoding of some bits within the data bits 602, a bit selection 680 may be performed to select data bits 642 for a second repeated transmission. In certain implementations, the transmitting device attaches 644 CRC bits to data bits 642 to generate a data vector 646 having $k_3$ bits. The data vector 646 is transformed by a masked encoder 648 into an intermediate vector 650 having $N_3$ bits. The intermediate vector 650 may be transformed by a rate match matrix 652 to generate a second transmission vector 654 having $M_3$ bits.

Referring to FIG. 6, if the transmitting device receives yet another indication of failed decoding of some bits within the data bits 602, a bit selection 680 may be performed to select data bits 662 for a third repeated transmission. In certain implementations, the transmitting device attaches 664 CRC bits to data bits 662 to generate a data vector 666 having $k_4$ bits. The data vector 666 is transformed by a masked encoder 668 into an intermediate vector 670 having $N_4$ bits. The intermediate vector 670 may be transformed by a rate match matrix 672 to generate a second transmission vector 674 having $M_4$ bits. More or fewer retransmissions than those shown in FIG. 6 may be supported Turning to FIG. 7, which illustrates examples of masked encoders 608, 628, 648, 668 used in polar encoding of masked u-domain vectors. In some implementations, the data vectors 606, 626, 646, 666 may be input of the masked encoders 608, 628, 648, 668. Mapping matrices may map the data vectors 606, 626, 646, 666 to $N_{MAX}$ vectors 712, 722, 732, 742. The $N_{MAX}$ vectors 712, 722, 732, 742 may each include $N_{MAX}$ bits. During the initial transmission, the $N_{MAX}$ vector 712 may be truncated by selecting 714 last $N_1$ bits of the $N_{MAX}$ bits to generate an intermediate vector 716. The intermediate vector 716 may have $N_1$ bits, where $N_1$ may be less than or equal to $N_{MAX}$. Next, the intermediate vector 716 may be transformed by a polar encoding matrix 718.

Figure 7:
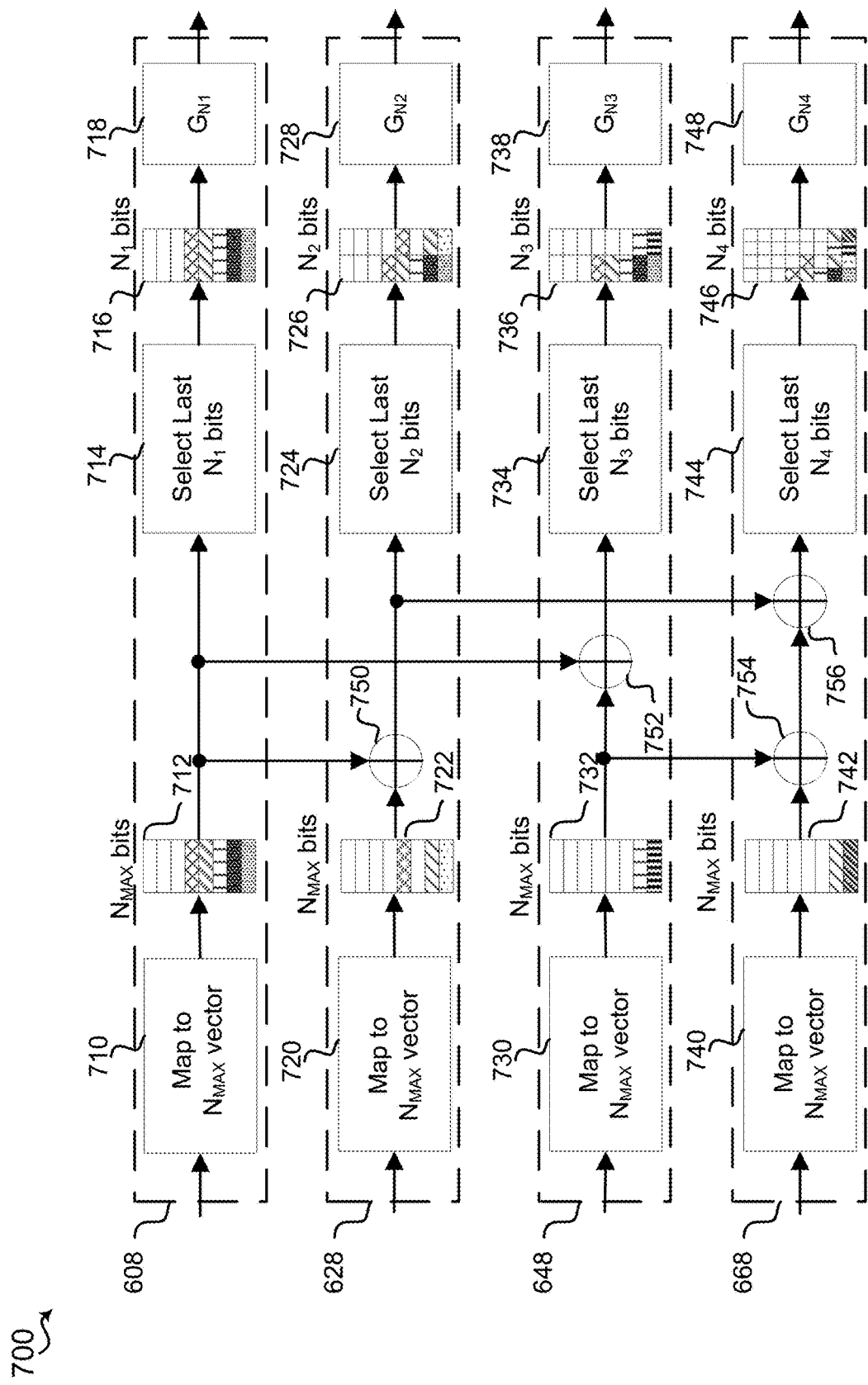
FIG. 7 illustrates examples of masked encoders used in polar encoding of masked u-domain vectors.

Still referring to FIG. 7, during the first repeated transmission, the $N_{MAX}$ vector 722 may be masked by the $N_{MAX}$ vector 712 using a bit-wise addition operation 750. After the masking process, the masked $N_{MAX}$ vector 722 may be truncated by selecting 724 last $N_2$ bits of the $N_{MAX}$ bits to generate an intermediate vector 726. The intermediate vector 726 may have $N_2$ bits, where $N_2$ may be less than or equal to $N_{MAX}$. Next, the intermediate vector 726 may be transformed by a polar encoding matrix 728.

Referring again to FIG. 7, during the second repeated transmission, the $N_{MAX}$ vector 732 may be masked by the $N_{MAX}$ vector 712 using a bit-wise addition operation 752. After the masking process, the masked $N_{MAX}$ vector 732 may be truncated by selecting 734 last $N_3$ bits of the $N_{MAX}$ bits to generate an intermediate vector 736. The intermediate vector 736 may have $N_3$ bits, where $N_3$ may be less than or equal to $N_{MAX}$. Next, the intermediate vector 736 may be transformed by a polar encoding matrix 738.

Referring still to FIG. 7, during the third repeated transmission, the $N_{MAX}$ vector 742 may be masked by the $N_{MAX}$ vectors 712, 732 using bit-wise addition operations 754, 756. After the masking process, the masked $N_{MAX}$ vector 742 may be truncated by selecting 744 last $N_3$ bits of the $N_{MAX}$ bits to generate an intermediate vector 746. The intermediate vector 746 may have $N_4$ bits, where $N_4$ may be less than or equal to $N_{MAX}$. Next, the intermediate vector 746 may be transformed by a polar encoding matrix 748.

Turning to FIG. 8, which illustrates an example of a matrix 800 for generating masks for the u-domain vectors. The mask for the u-domain vector for the i-th transmission may be expressed as $v_i = [u_1, u_2, \ldots, u_{i-1}] \times S_i$ where $S_i = \text{kron}(R_{[1:i-1,i]}, I_{N_{max}}) = R_{[1:i-1,i]} \otimes I_{N_{max}}$. Here, R is a matrix $$R = \begin{bmatrix} 1 & 1 \\ 0 & 1 \end{bmatrix}^{\otimes T},$$

T is the maximum transmission times. $I_{N_{max}}$ is the $N_{max}$ by $N_{max}$ sized identity matrix. In the block diagram 800, masks 802, 804 are the masks for the u-domain vectors for the third and fifth transmissions. In some examples, the first, second, third, fourth, fifth, sixth, seventh, and eighth masks may be 0, $u_1$, $u_1$, $u_1+u_2+u_3$, $u_1$, $u_1+u_2+u_5$, $u_1+u_3+u_5$, and $u_1+u_2+u_3+u_4+u_5+u_6+u_7$, respectively.

Figure 9:
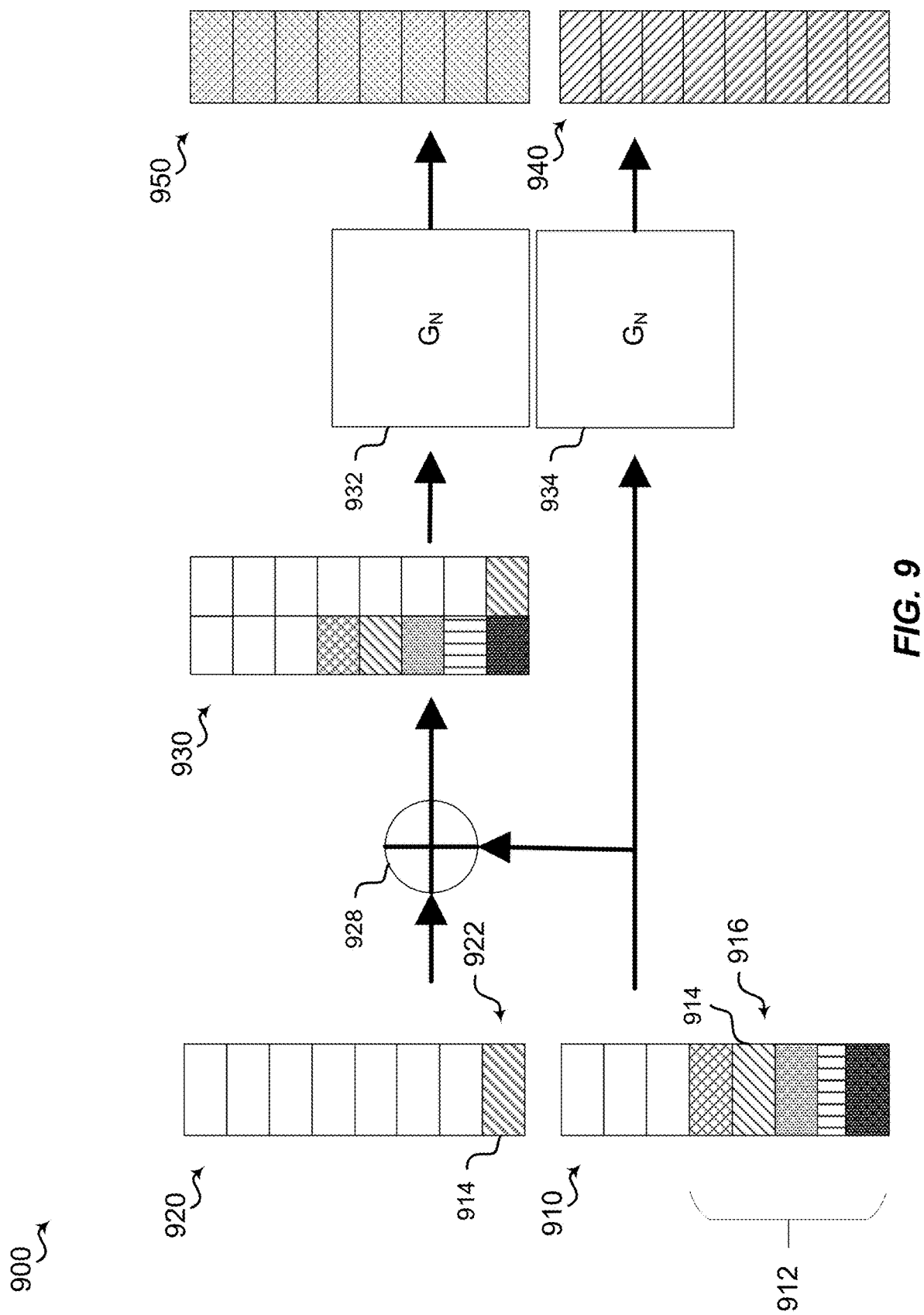
FIG. 9 is an example of a block diagram for active bit relocation for polar encoding with two transmissions.

FIG. 9 illustrates an example of a block diagram 900 for active bit relocation for polar encoding with two transmissions. To achieve active bit relocation, the best K indices are picked out from all the $N_1+N_2+\ldots+N_t$ polarized channels, and where $K_t$ active-bits from block [1, 2, t−1] are relocated to block t. During the first transmission, a u-domain vector 910 is transformed by a polar encoding matrix 934 into a transmission vector 940. The u-domain vector 910 may include one or more data bits 912, a repeated bit 914 in an unreliable transmission location 916. After the transmission of the transmission vector 940, a second transmission may be initiated due to the failed decoding of the repeated bit 914. During the second transmission, a u-domain vector 920 may include the repeated bit 914 at a reliable transmission location 922. The u-domain vector 920 may be bit-wised added 928 with the u-domain vector 910 to form an intermediate vector 930. The intermediate vector 930 may be transformed a polar encoding matrix 932 into a transmission vector 950. The repeated bit 914 may be relocated to the reliable transmission location 922 having a higher transmission reliability than the unreliable transmission location 916. For example, the unreliable transmission location 916 may be a resource location where information transmitted has a low probability (e.g. 10% for every transmission) of being decoded by receiving device. The reliable transmission location 922 may be a different resource location where information transmitted has a high probability (e.g. 99% for every transmission) of being decoded by receiving device. At the receiving device, the u-domain vector 920 may be decoded before the u-domain vector 910.

FIGS. 10-21 illustrate examples of active bit relocation for polar encoding with two transmissions using two modes.

Figure 10:
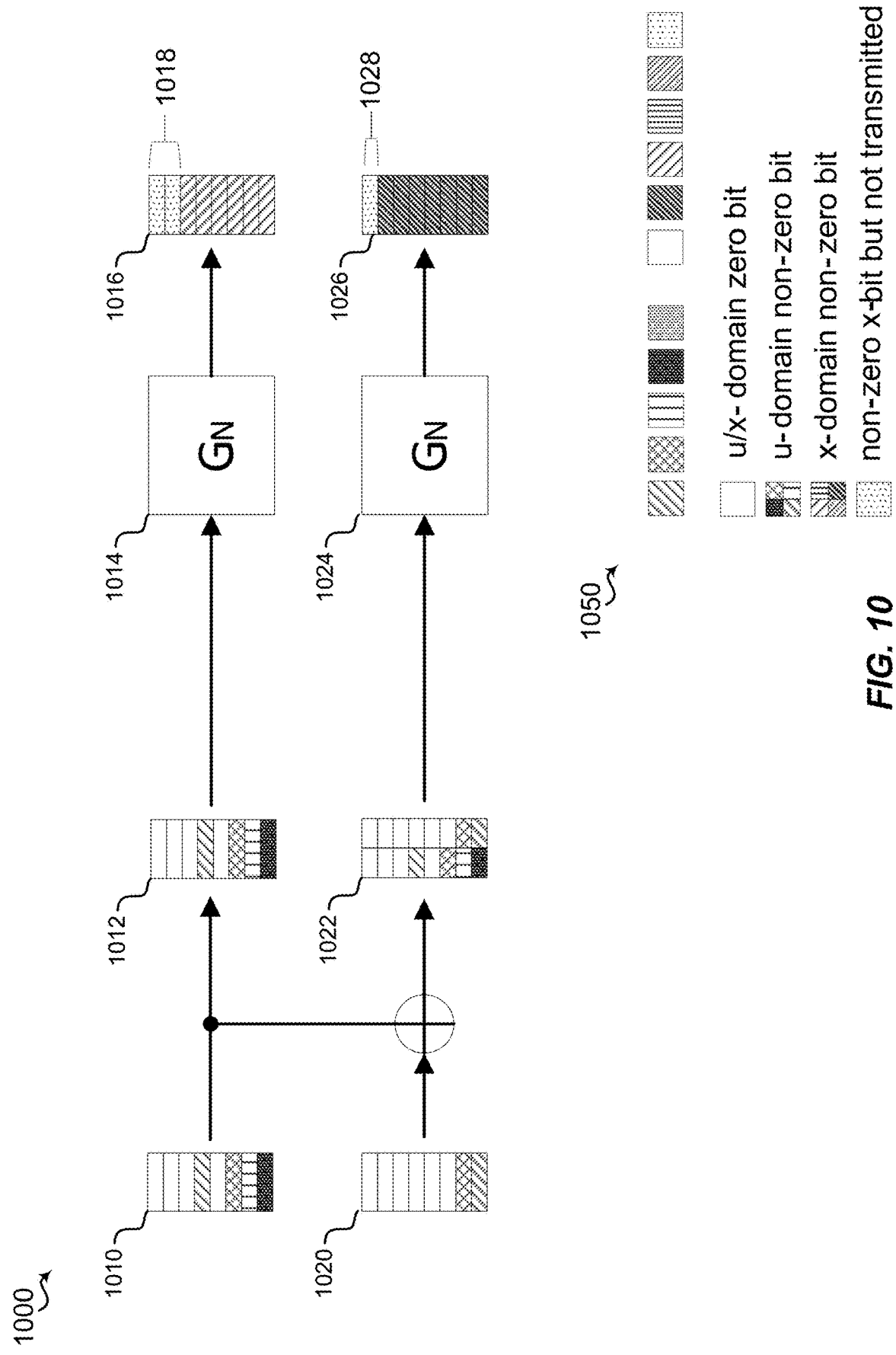
FIGS. 10-21 illustrate examples of active bit relocation for polar encoding with two transmissions using two modes.

Referring now to FIG. 10, which shows an example of a block diagram 1000 for active bit relocation for polar encoding with two transmissions. The first transmission may utilize puncture or repetition mode, and the second transmission may utilize puncture or repetition mode. For example, during the first transmission, a u-domain vector 1010, or an intermediate vector 1012 may be transformed, via a polar encoding matrix 1014, into a transmission vector 1016. In puncture mode, bits 1018 in the transmission vector 1016 may not be transmitted. During the second transmission, a u-domain vector 1020 may be bit-wised added with the u-domain vector 1010 to produce an intermediate vector 1022. The intermediate vector 1022 may be transformed by a polar encoding matrix 1024 into a transmission vector 1026. In repetition mode, bits 1028 in the transmission vector 1026 may not be transmitted during retransmission while remaining bits in the transmission vector 1026 are retransmitted. A legend 1050 indicates the types of bits and their associated colors.

Figure 11:
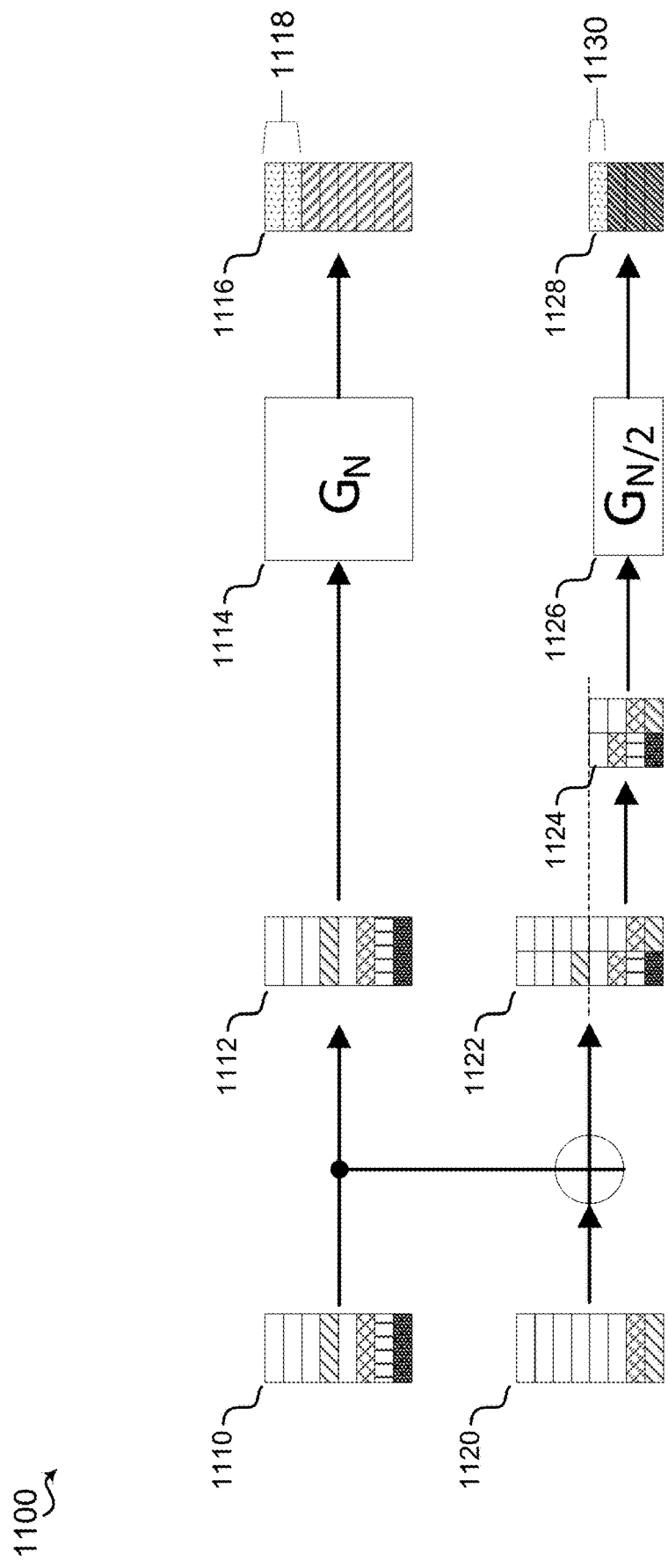

Referring now to FIG. 11, which shows an example of a block diagram 1100 for active bit relocation for polar encoding with two transmissions. The first transmission may utilize puncture or repetition mode, and the second transmission may utilize puncture or repetition mode. For example, during the first transmission, a u-domain vector 1110 or an intermediate vector 1112 may be transformed, via a polar encoding matrix 1114, into a transmission vector 1116 having N bits. In puncture mode, bits 1118 in the transmission vector 1016 may not be transmitted. During the second transmission, a u-domain vector 1120 may be bit-wised added with the u-domain vector 1110 to produce an intermediate vector 1122. The intermediate vector 1122 may be shortened to produce a shortened intermediate vector 1124. The intermediate vector 1124 may be transformed by a polar encoding matrix 1116 into a transmission vector 1128 having N/2 bits. In repetition mode, bits 1130 in the transmission vector 1128 may not be transmitted during retransmission while remaining bits in the transmission vector 1128 are retransmitted.

Figure 12:
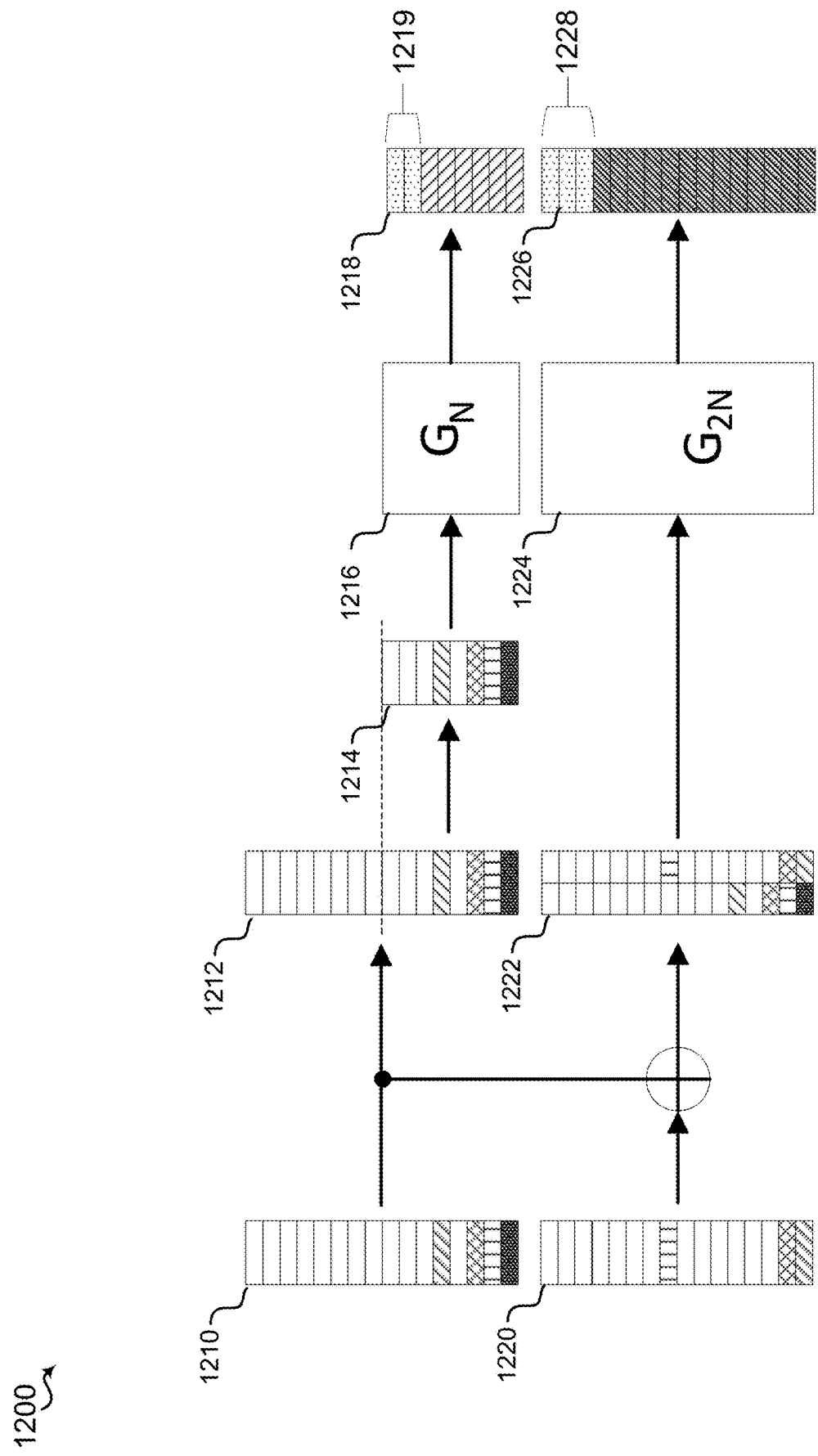

Referring now to FIG. 12, which shows an example of a block diagram 1200 for active bit relocation for polar encoding with two transmissions. The first transmission may utilize puncture or repetition mode, and the second transmission may utilize puncture or repetition mode. For example, during the first transmission, a u-domain vector 1210 may be mapped to an intermediate vector 1212. The intermediate vector 1212 may be shortened into a shortened intermediate vector 1214 by removing a portion of the bits in the intermediate vector 1212. Next, the shortened intermediate vector 1214 may be transformed, via a polar encoding matrix 1216, into a transmission vector 1218 having N bits. In puncture mode, bits 1219 in the transmission vector 1218 may not be transmitted. During the second transmission, a u-domain vector 1220 may be bit-wised added with the u-domain vector 1210 to produce an intermediate vector 1222. The intermediate vector 1222 may be transformed by a polar encoding vector 1224 into a transmission vector 1226 having 2N bits. In repetition mode, bits 1228 in the transmission vector 1126 may not be transmitted during retransmission while remaining bits in the transmission vector 1226 are retransmitted.

Figure 13:
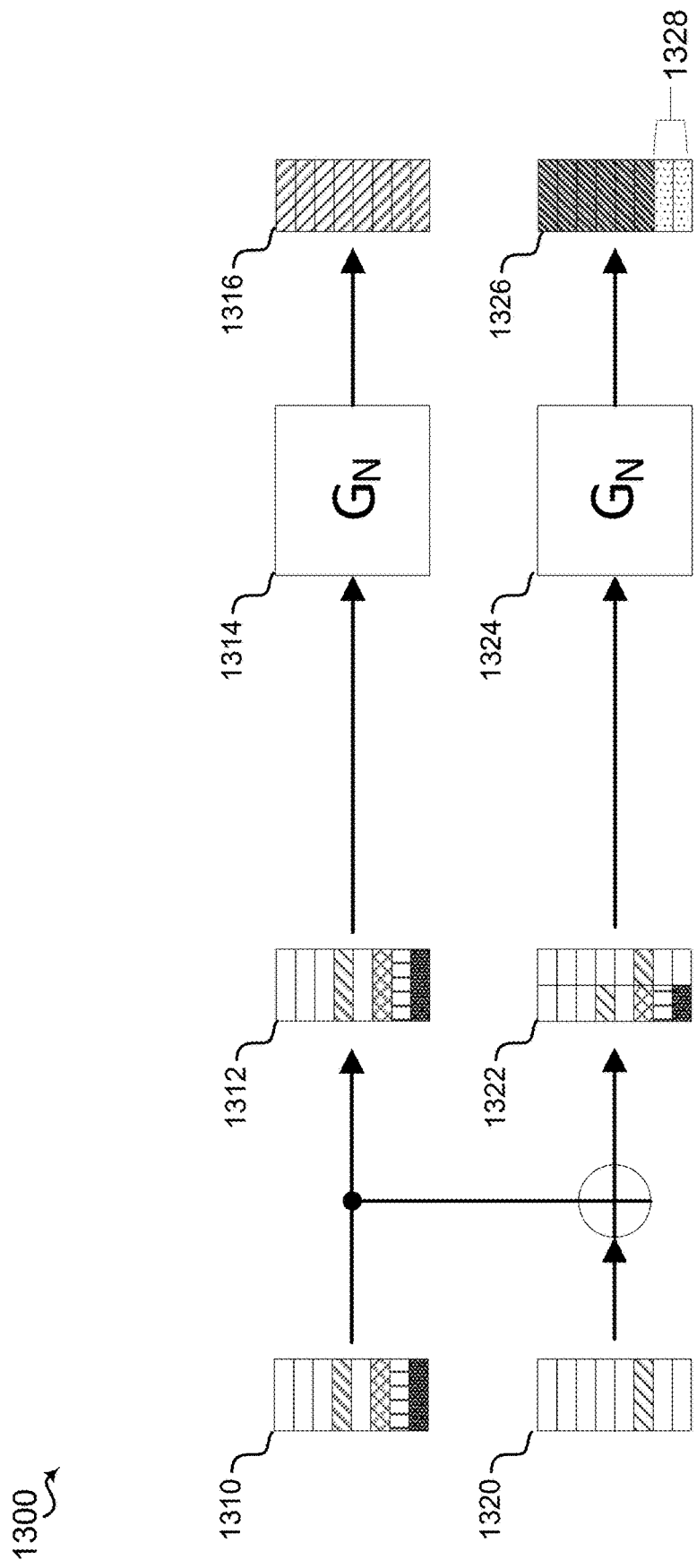

Referring now to FIG. 13, which shows an example of a block diagram 1300 for active bit relocation for polar encoding with two transmissions. The first transmission may utilize puncture or repetition mode, and the second transmission may utilize shorten mode. For example, during the first transmission, a u-domain vector 1310, or an intermediate vector 1312 may be transformed, via a polar encoding matrix 1314, into a transmission vector 1316. During the second transmission, a u-domain vector 1320 may be bit-wised added with the u-domain vector 1310 to produce an intermediate vector 1322. The intermediate vector 1322 may be transformed by a polar encoding matrix 1324 into a transmission vector 1326. In shorten mode, bits 1328 in the transmission vector 1326 may be zero-valued and unnecessary to transmit.

Figure 14:
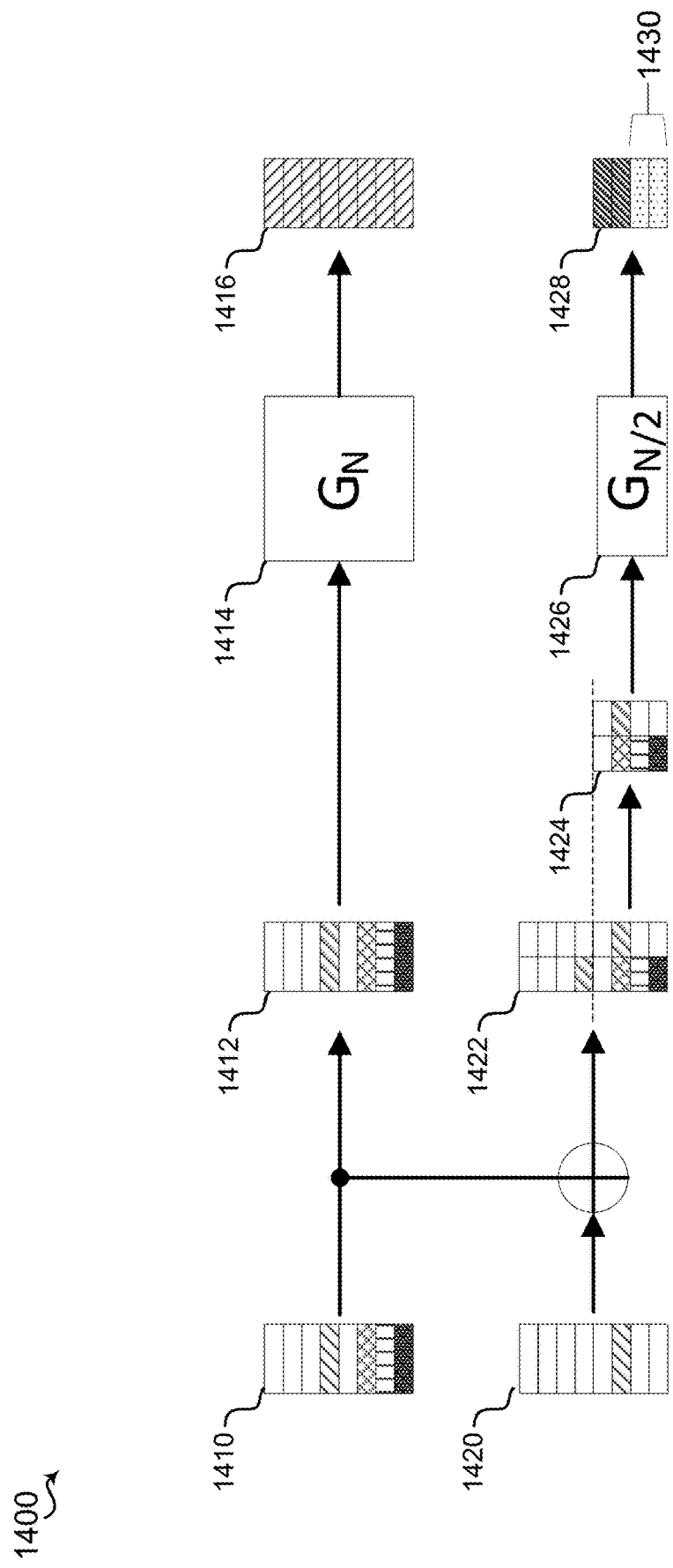

Referring now to FIG. 14, which shows an example of a block diagram 1400 for active bit relocation for polar encoding with two transmissions. The first transmission may utilize puncture or repetition mode, and the second transmission may utilize shorten mode. For example, during the first transmission, a u-domain vector 1410 or an intermediate vector 1412 may be transformed, via a polar encoding matrix 1414, into a transmission vector 1416 having N bits. During the second transmission, a u-domain vector 1420 may be bit-wised added with the u-domain vector 1410 to produce an intermediate vector 1422. The intermediate vector 1422 may be shortened to produce a shortened intermediate vector 1424. The intermediate vector 1424 may be transformed by a polar encoding matrix 1426 into a transmission vector 1428 having N/2 bits. In shorten mode, bits 1430 in the transmission vector 1428 may be zero-valued and unnecessary to transmit.

Figure 15:
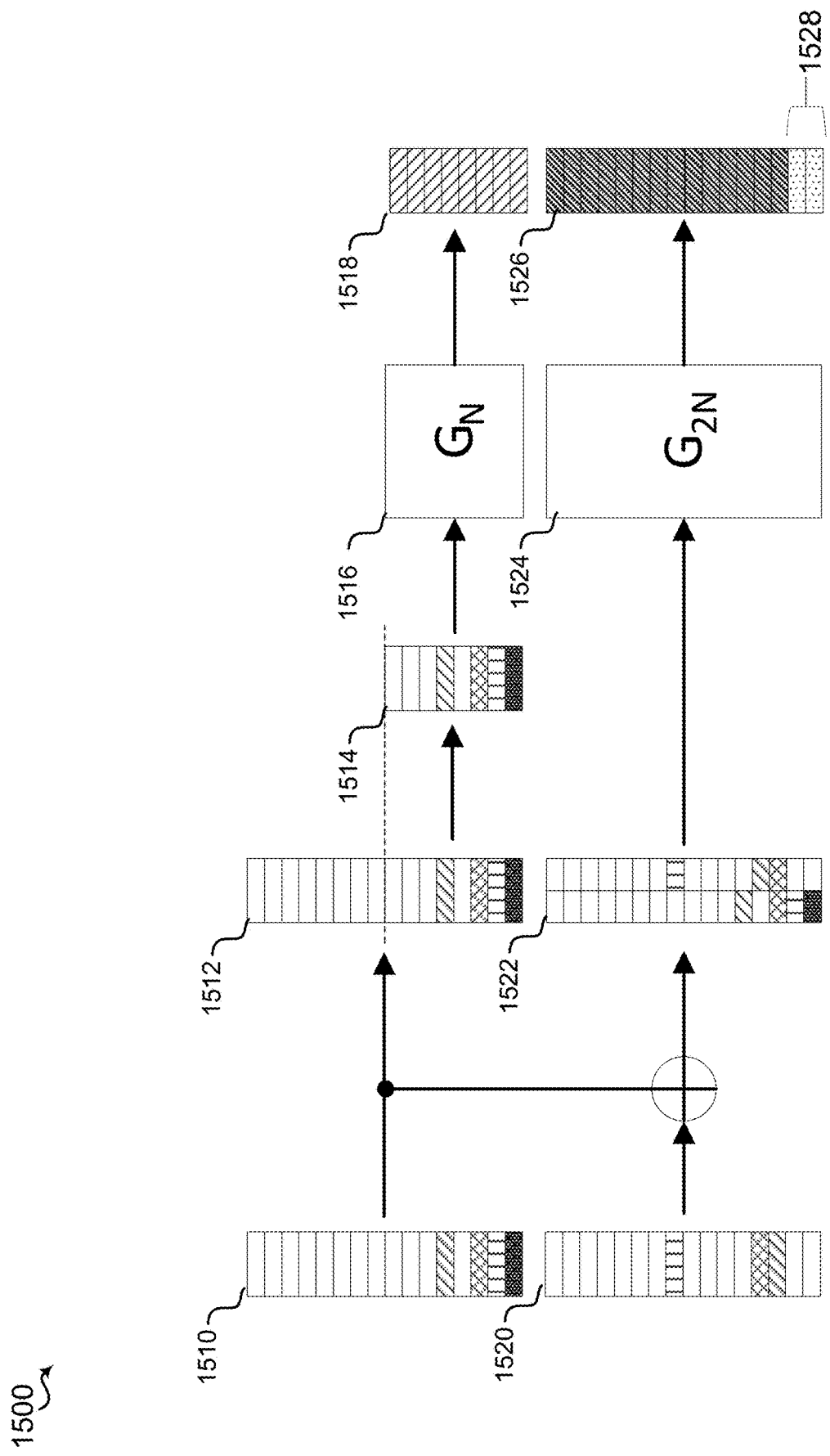

Referring now to FIG. 15, which shows an example of a block diagram 1500 for active bit relocation for polar encoding with two transmissions. The first transmission may utilize puncture or repetition mode, and the second transmission may utilize shorten mode. For example, during the first transmission, a u-domain vector 1510 may be mapped to an intermediate vector 1512. The intermediate vector 1512 may be shortened into a shortened intermediate vector 1514 by removing a portion of the bits in the intermediate vector 1512. Next, the shortened intermediate vector 1514 may be transformed, via a polar encoding matrix 1516, into a transmission vector 1518 having N bits. During the second transmission, a u-domain vector 1520 may be bit-wised added with the u-domain vector 1510 to produce an intermediate vector 1522. The intermediate vector 1522 may be transformed by a polar encoding vector 1524 into a transmission vector 1526 having 2N bits. In shorten mode, bits 1528 in the transmission vector 1526 may be zero-valued and unnecessary to transmit.

Figure 16:
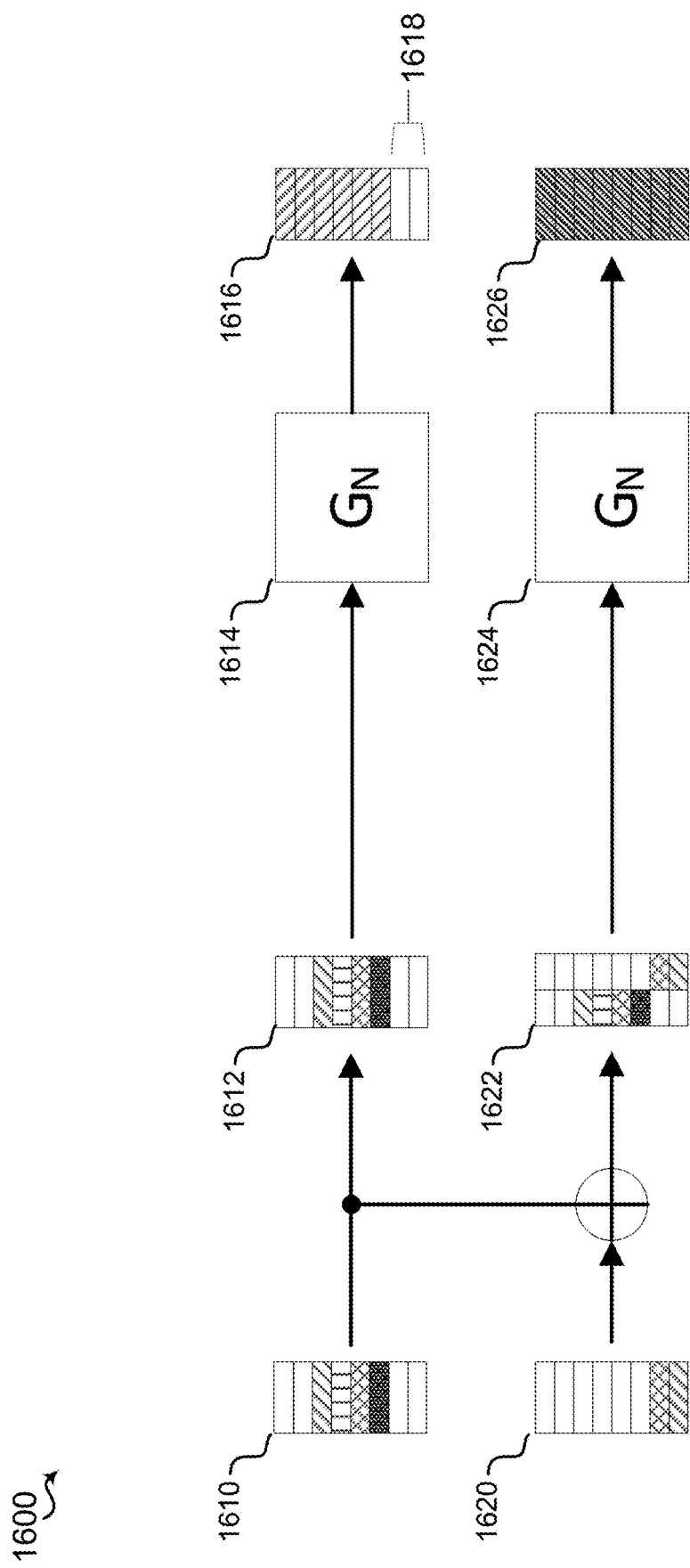

Referring now to FIG. 16, which shows an example of a block diagram 1600 for active bit relocation for polar encoding with two transmissions. The first transmission may utilize shorten mode, and the second transmission may utilize puncture or repetition mode. For example, during the first transmission, a u-domain vector 1610, or an intermediate vector 1612 may be transformed, via a polar encoding matrix 1614, into a transmission vector 1616. In shorten mode, bits 1618 in the transmission vector 1616 may be zero-valued and unnecessary to transmit. During the second transmission, a u-domain vector 1620 may be bit-wised added with the u-domain vector 1610 to produce an intermediate vector 1622. The intermediate vector 1622 may be transformed by a polar encoding matrix 1624 into a transmission vector 1626.

Figure 17:
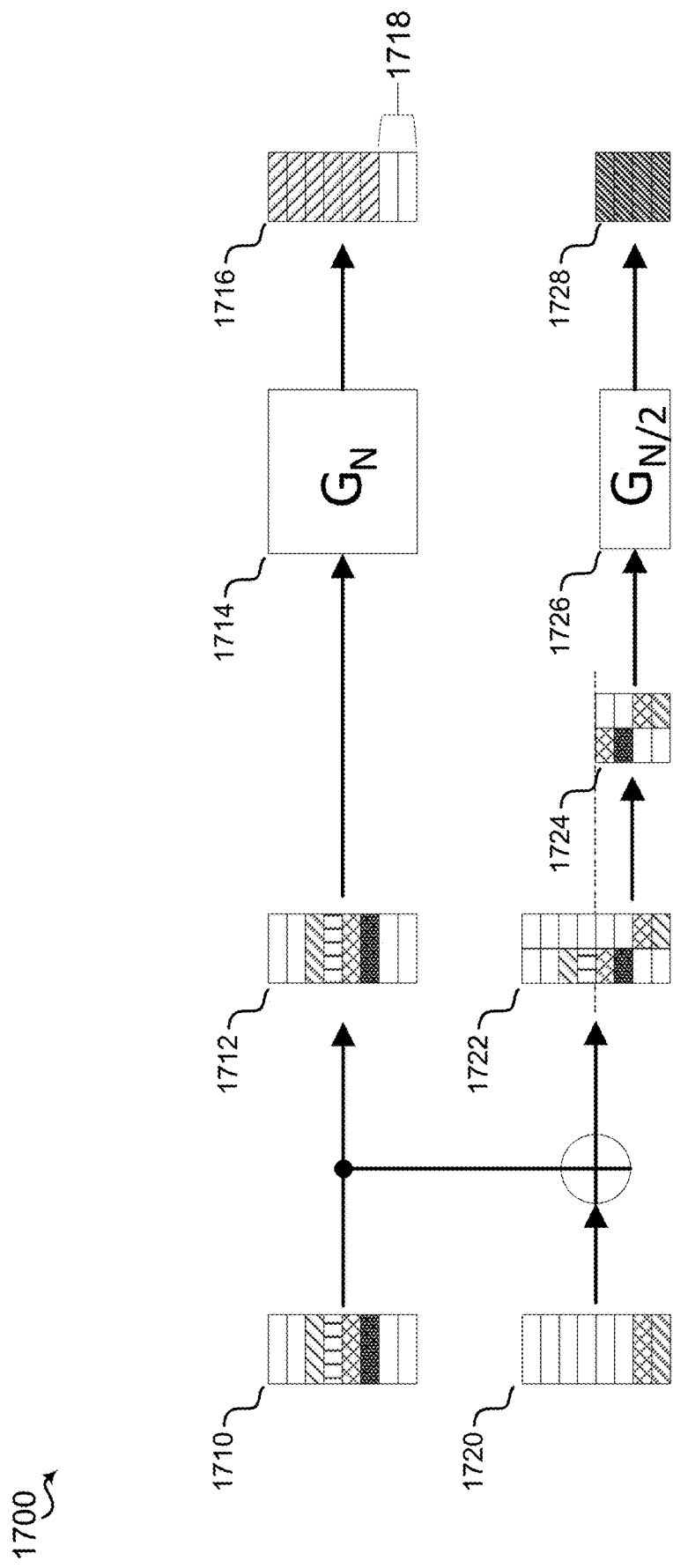

Referring now to FIG. 17, which shows an example of a block diagram 1700 for active bit relocation for polar encoding with two transmissions. The first transmission may utilize shorten mode, and the second transmission may utilize puncture or repetition mode. For example, during the first transmission, a u-domain vector 1710 or an intermediate vector 1712 may be transformed, via a polar encoding matrix 1714, into a transmission vector 1716 having N bits. In repetition mode, bits 1718 in the transmission vector 1716 may be zero-valued and unnecessary to transmit. During the second transmission, a u-domain vector 1720 may be bit-wised added with the u-domain vector 1710 to produce an intermediate vector 1722. The intermediate vector 1722 may be shortened to produce a shortened intermediate vector 1724. The intermediate vector 1724 may be transformed by a polar encoding matrix 1726 into a transmission vector 1728 having N/2 bits.

Figure 18:
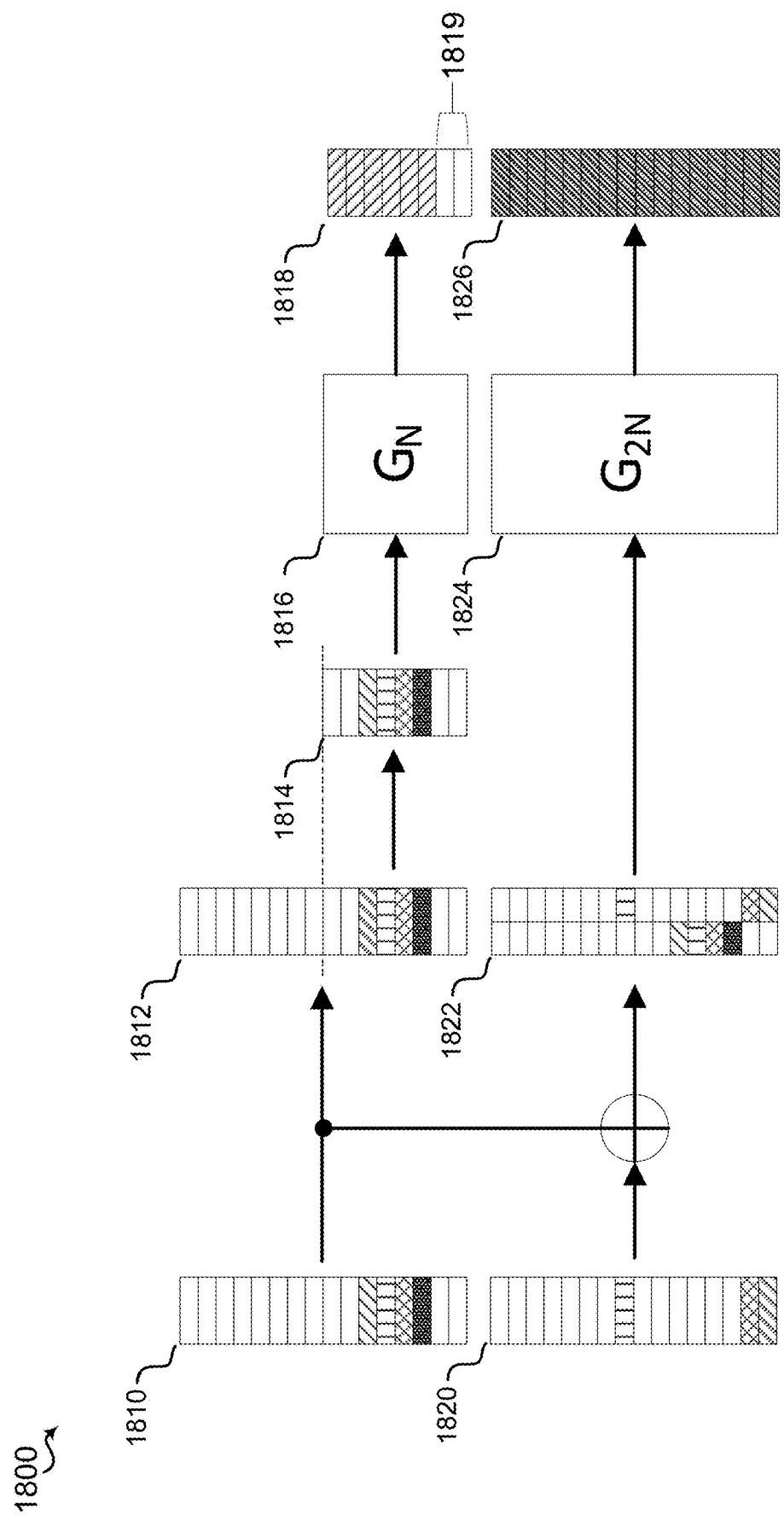

Referring now to FIG. 18, which shows an example of a block diagram 1800 for active bit relocation for polar encoding with two transmissions. The first transmission may utilize shorten mode, and the second transmission may utilize puncture or repetition mode. For example, during the first transmission, a u-domain vector 1810 may be mapped to an intermediate vector 1812. The intermediate vector 1812 may be shortened into a shortened intermediate vector 1814 by removing a portion of the bits in the intermediate vector 1812. Next, the shortened intermediate vector 1814 may be transformed, via a polar encoding matrix 1816, into a transmission vector 1818 having N bits. In shorten mode, bits 1819 in the transmission vector 1818 may be zero-valued and unnecessary to transmit. During the second transmission, a u-domain vector 1820 may be bit-wised added with the u-domain vector 1810 to produce an intermediate vector 1822. The intermediate vector 1822 may be transformed by a polar encoding vector 1824 into a transmission vector 1826 having 2N bits.

Figure 19:
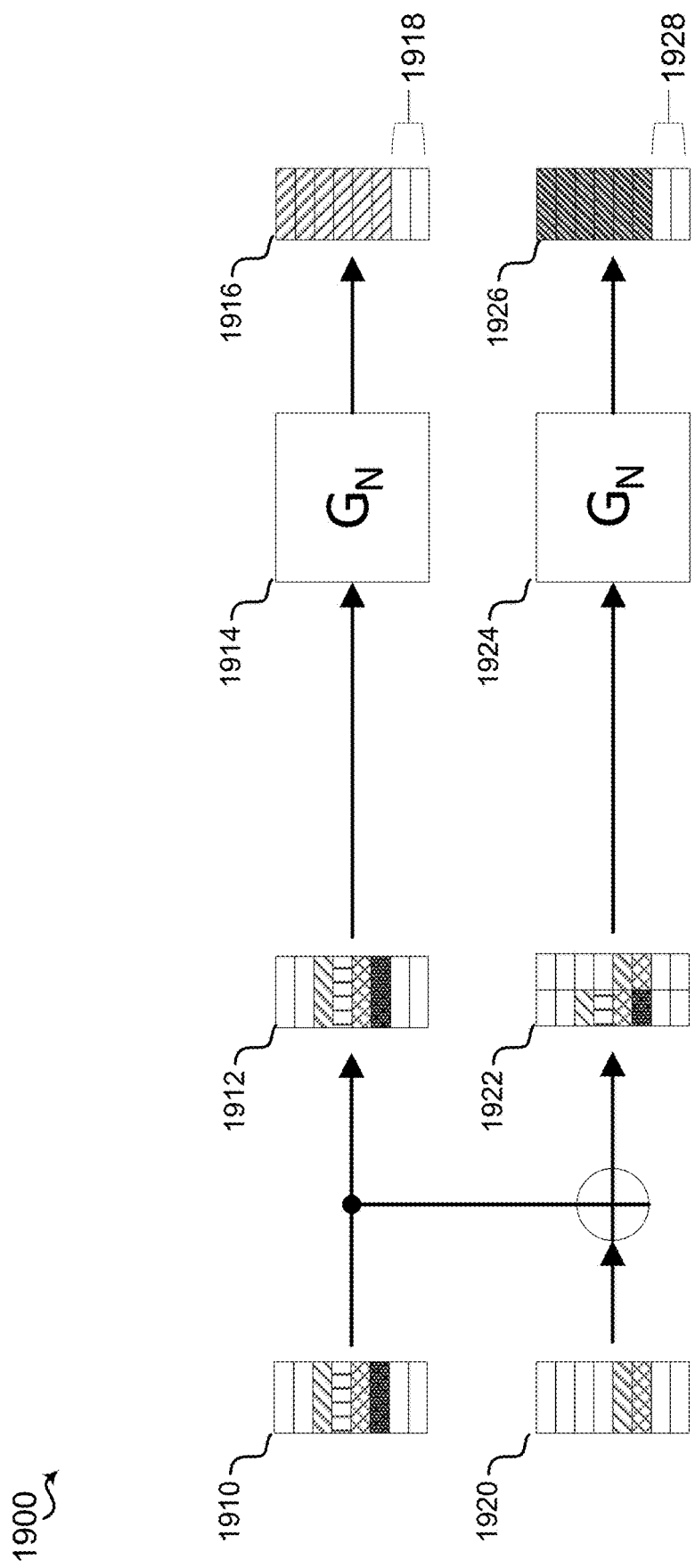

Referring now to FIG. 19, which shows an example of a block diagram 1900 for active bit relocation for polar encoding with two transmissions. The first transmission may utilize shorten mode, and the second transmission may utilize shorten mode. For example, during the first transmission, a u-domain vector 1910, or an intermediate vector 1912 may be transformed, via a polar encoding matrix 1914, into a transmission vector 1916. In shorten mode, bits 1918 in the transmission vector 1916 may be zero-valued and unnecessary to transmit. During the second transmission, a u-domain vector 1920 may be bit-wised added with the u-domain vector 1910 to produce an intermediate vector 1922. The intermediate vector 1922 may be transformed by a polar encoding matrix 1624 into a transmission vector 1926. In shorten mode, bits 1928 in the transmission vector 1926 may be zero-valued and unnecessary to transmit. Here, bits 1918 and bits 1928 have the same lengths, i.e. transmission vectors 1916, 1926 have the same number of shortened bits.

Figure 20:
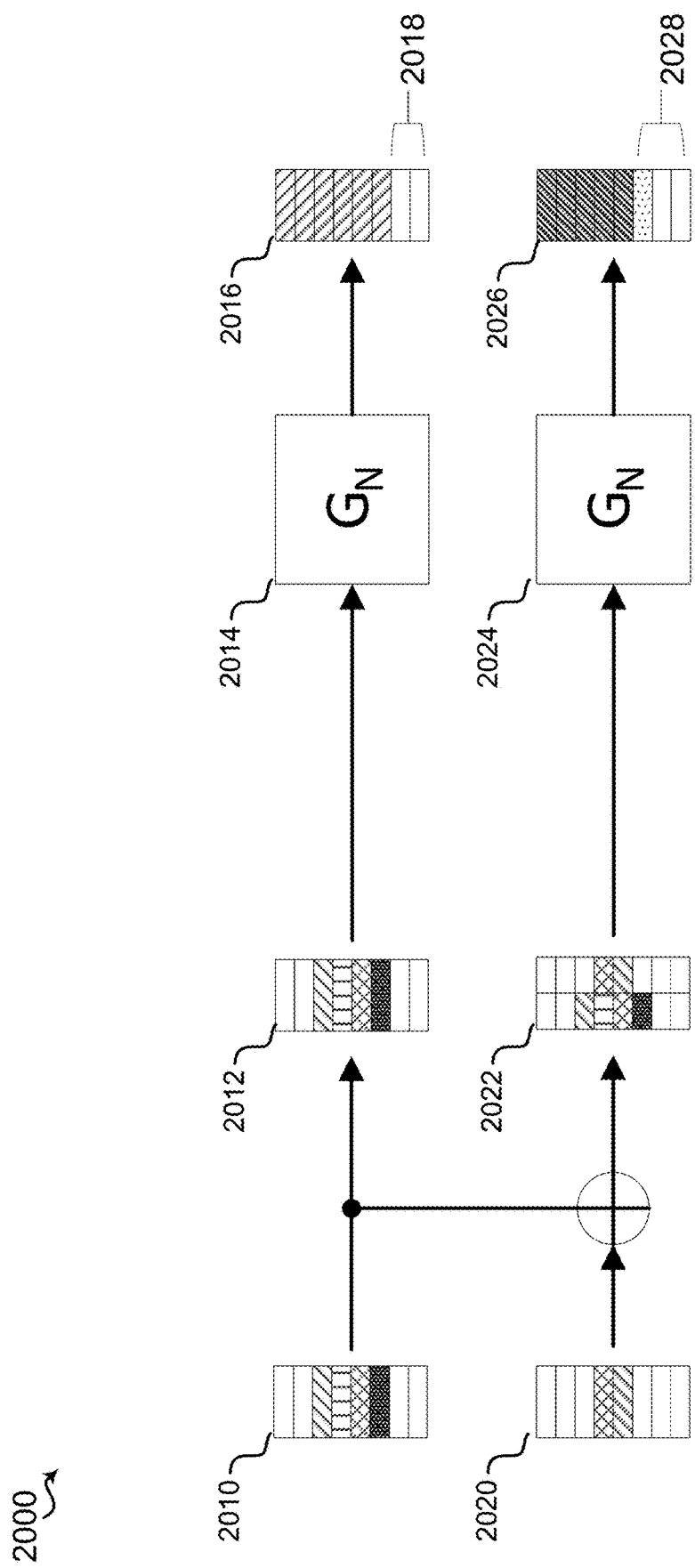

Referring now to FIG. 20, which shows an example of a block diagram 2000 for active bit relocation for polar encoding with two transmissions. The first transmission may utilize shorten mode, and the second transmission may utilize shorten mode. For example, during the first transmission, a u-domain vector 2010 or an intermediate vector 2012 may be transformed, via a polar encoding matrix 2014, into a transmission vector 2016. In shorten mode, bits 2018 in the transmission vector 2016 may be zero-valued and unnecessary to transmit. During the second transmission, a u-domain vector 2020 may be bit-wised added with the u-domain vector 2010 to produce an intermediate vector 2022. The intermediate vector 2022 may be transformed by a polar encoding matrix 2024 into a transmission vector 2026. In shorten mode, bits 2028 in the transmission vector 2026 may be zero-valued and unnecessary to transmit. Here, bits 2018 and bits 2028 have different lengths, i.e. the transmission vector 2016 has a smaller number of shortened bits than the transmission vector 2026.

Figure 21:
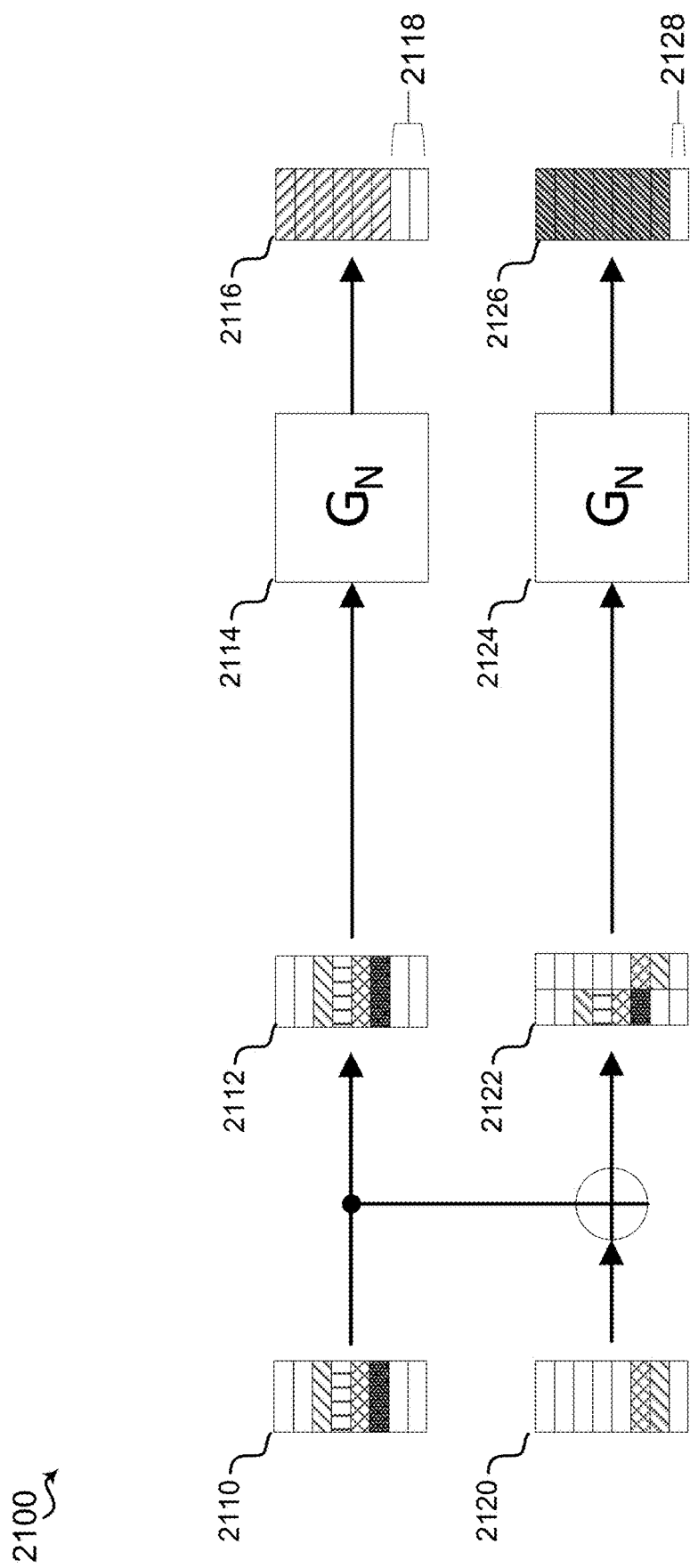

Referring now to FIG. 21, which shows an example of a block diagram 2100 for active bit relocation for polar encoding with two transmissions. The first transmission may utilize shorten mode, and the second transmission may utilize shorten mode. For example, during the first transmission, a u-domain vector 2110 or an intermediate vector 2112 may be transformed, via a polar encoding matrix 2114, into a transmission vector 2116. In shorten mode, bits 2118 in the transmission vector 2116 may be zero-valued and unnecessary to transmit. During the second transmission, a u-domain vector 2120 may be bit-wised added with the u-domain vector 2110 to produce an intermediate vector 2122. The intermediate vector 2122 may be transformed by a polar encoding matrix 2124 into a transmission vector 2126. In shorten mode, bits 2128 in the transmission vector 2126 may be zero-valued and unnecessary to transmit. Here, bits 2118 and bits 2128 have different lengths, i.e. the transmission vector 2116 has a larger number of shortened bits than the transmission vector 2126.

Figure 22:
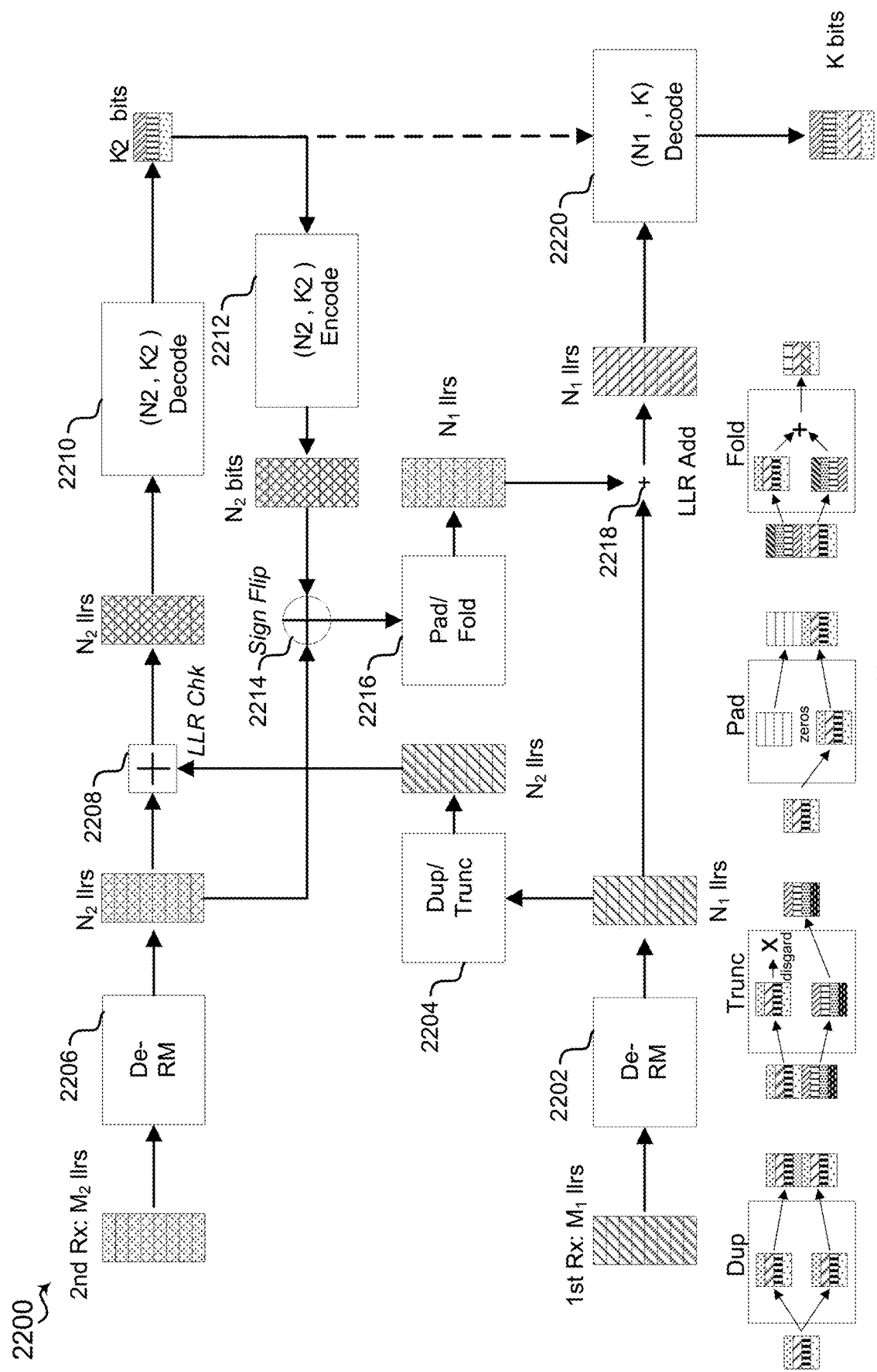
FIG. 22 is an example of a block diagram of the decoding process.

Turning now to FIG. 22, which illustrates an example of a block diagram 2200 of the decoding process. The receiving device receives a first LLRs during the first reception and a second LLRs during the second reception. After receiving the first LLRs, the receiving device performs a de-ratematch 2202 on the first LLRs to produce a first $N_1$ LLRs. The receiving device also performs a de-ratematch 2206 on the second LLRs to produce a first $N_2$ LLRs. Depending on the length of the $N_1$ LLRs and $N_2$ LLRs, a duplication or truncation 2204 is performed on the $N_1$ LLRs to generate a second $N_2$ LLRs. The first $N_2$ LLRs and second $N_2$ LLRs are combined using a LLR domain check 2208 to create a final $N_2$ LLRs. The final $N_2$ LLRs is decoded with a decoding matrix 2210 to extract the $k_2$ bits.

Still referring to FIG. 22, the extracted $k_2$ bits may be encoded with a encoding matrix 2212 to obtain $N_2$ bits. Next, the sign of the first $N_2$ LLRs is flipped 2214 and padded or folded 2216 to generate a second $N_1$ LLRs. The first and second $N_1$ LLRs are then added 2218 to create a final $N_1$ LLRs, which may be decoded with a decoding matrix 2220 to obtain the original k bits from the transmitting device. The duplication (Dup), truncation (Trunc), padding (Pad), and Folding (Fold) processes are displayed at the bottom of FIG. 22.

Figure 23:
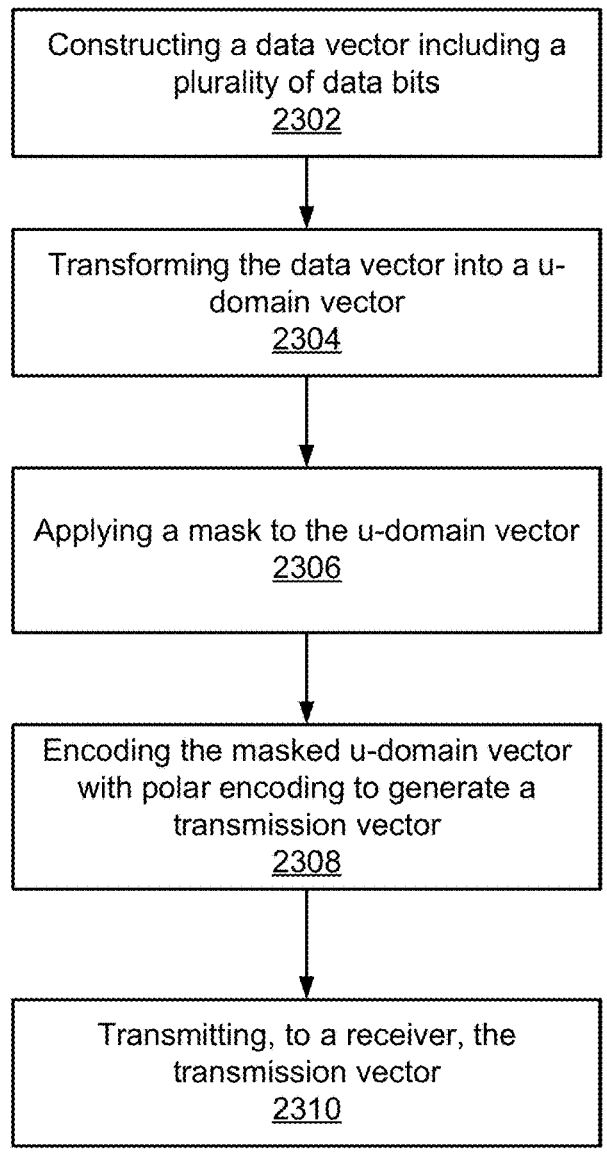
FIG. 23 a flow chart of a method for masking u-domain vectors for polar encoding.

FIG. 23 is a flow chart of a method 2300 for masking u-domain vectors for polar encoding. At block 2302, the method 2300 may construct a data vector including a plurality of data bits. For example, the data component 150 of the UE 110 may construct a data vector including a plurality of data bits. The data bits may include audio, video, textual, or other information that the UE 110 uploads to the BS 105.

At block 2304, the method 2300 may transform the data vector into a u-domain vector. For example, the encoding component 154 of the UE 110 may transform the data vector into a u-domain vector. The transformation may include multiplying the data vector by a matrix. The u-domain vector may include more bits than the data vector. In a non-limiting example, the encoding component 15 of the UE 110 may multiply the data vector 402 by the mapping matrix 404 to transform the data vector 402 into the u-domain vector 406. The lengths of the data vector 402 and the u-domain vector 406 may be the same or different. The u-domain vector 406 may result from ratematching the data vector 402.

At block 2306, the method 2300 may mask the u-domain vector with a mask. For example, the masking component 152 of the UE 110 may mask the u-domain vector with a mask. The masking component 152 may also generate the mask depending on the order of transmission. For example, during the initial transmission of the data vector, the masking component 152 may select a mask having all zero bits. For the first and second retransmissions, the masking component 152 may select a mask having identical bits as the data vector. For the third retransmission, the masking component 152 may select a mask equal to the sum of the previous data vectors. In a non-limiting example, the masking component 152 of the UE 110 may mask the u-domain vector 406 by performing the bit-wise addition 410 with the masking vector 408. Other operations, such as bit-wise subtraction, convolution, or logical operations (e.g., AND, OR, NOT, NAND, NOR, XOR) may also be used for the masking process according to various aspects of the present disclosure. The masking process may move one or more bits from a first bit location (e.g., higher signal-to-interference-plus-noise ratio (SINR), higher bit error rate (BER), or higher block error rate (BLER)) to a second bit location (e.g., lower SINR, lower BER, or lower BLER).

At block 2308, the method 2300 may encode the masked u-domain vector with polar encoding to generate a transmission vector. For example, the encoding component 154 of the UE 110 may encode the masked u-domain vector with polar encoding to generate a transmission vector. Polar encoding may include a linear block error correcting code based on multiple recursive concatenation of shorter kernel codes. Other encoding methods may also be used (e.g., turbo code).

At block 2310, the method 2300 may transmit, to a receiving device, the transmission vector. For example, the communication component 156 of the UE 110 may transmit the transmission vector to the communication component 176 of the BS 105.

Figure 24:
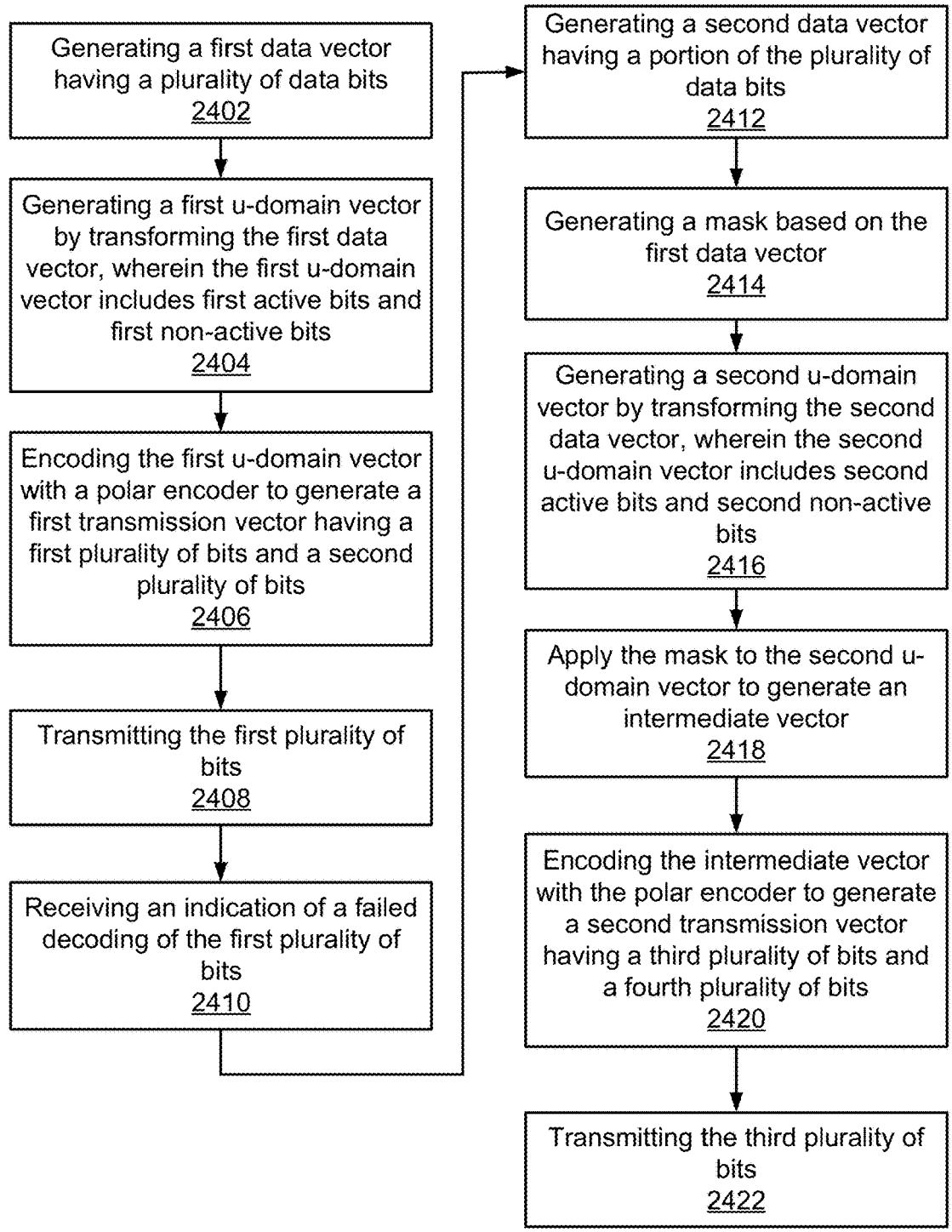
FIG. 24 is a flow chart of an example of a method of retransmitting coded messages.

FIG. 24 is a flow chart of an example of a method 2400 of retransmitting coded messages. At block 2402, the method 2400 may generate a first data vector having a plurality of data bits. For example, the data component 150 may generate a first data vector having a plurality of data bits, as described above.

At block 2404, the method 2400 may generate a first u-domain vector by transforming the first data vector, wherein the first u-domain vector includes first active bits and first non-active bits. For example, the encoding component 154 may generate a first u-domain vector by transforming the first data vector, wherein the first u-domain vector includes first active bits and first non-active bits. A non-limiting example of the first u-domain may be the intermediate vector 610 or the u-domain vector 910. The u-domain vector may include the one or more data bits 912 in the unreliable transmission location 916.

At block 2406, the method 2400 may encode the first u-domain vector with a polar encoder to generate a first transmission vector having a first plurality of bits and a second plurality of bits. For example, the encoding component 154 may encode the first u-domain vector with a polar encoder to generate a first transmission vector having a first plurality of bits and a second plurality of bits, such as the transmission vector 940.

At block 2408, the method 2400 may transmit the first plurality of bits. For example, the communication component 158 may transmit the first plurality of bits. In some implementations, the communication component 158 may transmit the transmission vector including the first plurality of bits and the second plurality of bits, such as the transmission vector 614 or the transmission vector 940. In other examples, the transmission vector may include the first plurality of bits.

At block 2410, the method 2400 may receive an indication of a failed decoding of the first plurality of bits. For example, the communication component 158 receive an indication of a failed decoding of the first plurality of bits.

At block 2412, in response to the indication of the failed decoding, the method 2400 may generate a second data vector having a portion of the plurality of data bits. For example, the data component 150 generate a second data vector having a portion of the plurality of data bits. In a non-limiting example, the second data vector may include some or all bits of the first plurality of bits, such as the data vector 626 or the data vector 920. The second data vector may include one or more CRC bits and/or one or more bits lost or failed to be decoded by the receiver during the transmission the first plurality of bits. The one or more bits lost or failed to be decoded may be relocated to the reliable transmission location 922 having a higher transmission reliability than the less reliable transmission location 916.

At block 2414, the method 2400 may generate a mask based on the first data vector. For example, the masking component 152 may generate a mask based on the first data vector. A non-limiting example of a mask may be the first data vector, such as the data vector 606. In some examples, the mask may be a u-domain vector, such as the u-domain vector 910.

At block 2416, the method 2400 may generate a second u-domain vector by transforming the second data vector, wherein the second u-domain vector includes second active bits and second non-active bits. For example, the encoding component 154 may generate a second u-domain vector by transforming the second data vector, wherein the second u-domain vector includes second active bits and second non-active bits. Some examples of the second u-domain vector may include the u-domain vector 920.

At block 2418, the method 2400 may apply the mask to the second u-domain vector to generate an intermediate vector. For example, the masking component 152 may mask the second u-domain vector with the mask to generate an intermediate vector. In certain implementations, the masking component 152 may mask the data vector 626, via the masked encoder 628, to generate the intermediate vector 630 or the intermediate vector 930.

At block 2420, the method 2400 may encode the intermediate vector with the polar encoder to generate a second transmission vector having a third plurality of bits and a fourth plurality of bits. For example, the encoding component 154 may encode the intermediate vector with the polar encoder to generate a second transmission vector having a third plurality of bits and a fourth plurality of bits. Examples of the transmission vector may include the transmission vector 634 or the transmission vector 950.

At block 2422, the method 2400 may transmit the third plurality of bits. For example, the communication component 158 may transmit the third plurality of bits. Depending on the operational mode (puncture, shorten, or repetition), the communication component 158 may transmit the third plurality of bits and/or the fourth plurality of bits. In some cases, the fourth plurality of bits may be zero-valued and not transmitted. In other cases, fourth plurality of bits may retain the values, but still not transmitted. In certain examples, the third plurality of bits may be retransmitted. Yet in another example, the third plurality of bits and the fourth plurality of bits may both be transmitted.

Figure 25:
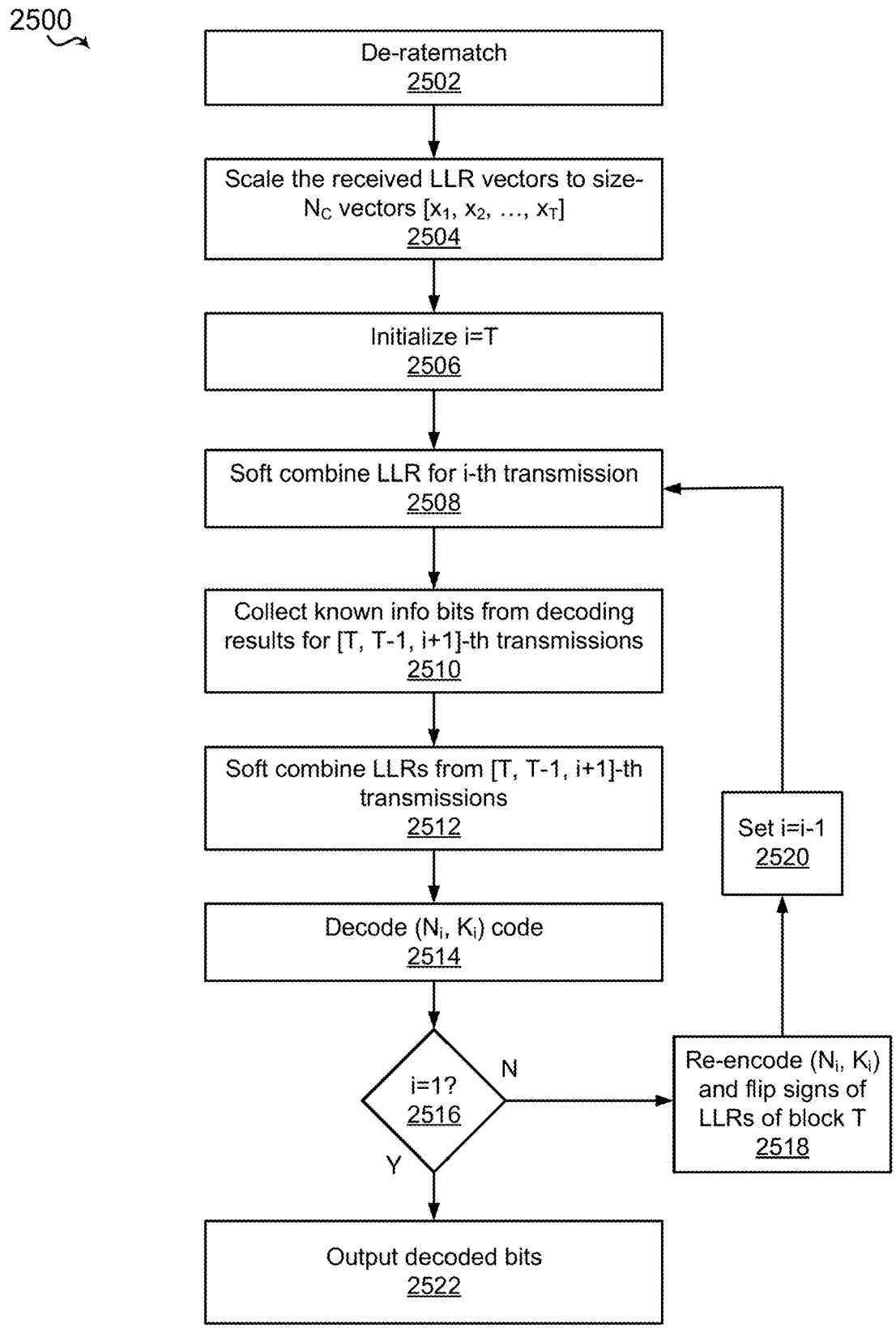
FIG. 25 is a flow chart of a method 2500 of decoding coded messages.

FIG. 25 is a flow chart of a method 2500 of decoding coded messages. The method 2500 may be implemented, partly or completely, by decoders illustrated in FIGS. 5 and 22. At block 2502, the method 2500 may de-ratematch 2502 received bits. For example, the decoding component 158 may de-ratematch 2502 received LLR vectors sent by a transmitting device.

At block 2504, the method 2500 may scale the received LLR vectors to size-Nc vectors [x1, x2, . . . , xT]. For example, the decoding component 158 may scale the received LLR vectors to size-Nc vectors [x1, x2, . . . , xT].

At block 2506, the method 2500 may initialize i=T. For example, the decoding component 158 may initialize i=T.

At block 2508, the method 2500 may soft combine LLR for i-th transmission. For example, the decoding component 158 may soft combine LLR for i-th transmission.

At block 2510, the method 2500 may collect known info bits from decoding results for [T, T−1, i+1]-th transmissions. For example, the decoding component 158 may collect known info bits from decoding results for [T, T−1, i+1]-th transmissions.

Next, at block 2512, the method 2500 may soft combine LLRs from [T, T−1, i+1]-th transmissions. For example, the decoding component 158 may soft combine LLRs from [T, T−1, i+1]-th transmissions.

At block 2514, the method 2500 may decode (Ni, Ki) code. For example, the decoding component 158 may decode (Ni, Ki) code.

At block 2516, the method 2500 may determine if i=1. For example, the decoding component 158 may determine if i=1.

At block 2518, if i does not equal to 1, the method 2500 may re-encode (Ni, Ki) and flip signs of LLRs of block T. For example, the encoding component 154 may re-encode (Ni, Ki) and flip signs of LLRs of block T.

At block 2520, the method 2500 may set i=i−1. For example, the decoding component may set i=i−1.

At block 2522, if the method 2500 determines that i=1 at block 2516, the method 2500 may output the decoded bits. For example, the communication component 156 may output the decoded bits.

In some implementations, the methods 2300, 2400, and 2500 may be implemented by the BS 105 and its corresponding components.

Figure 26:
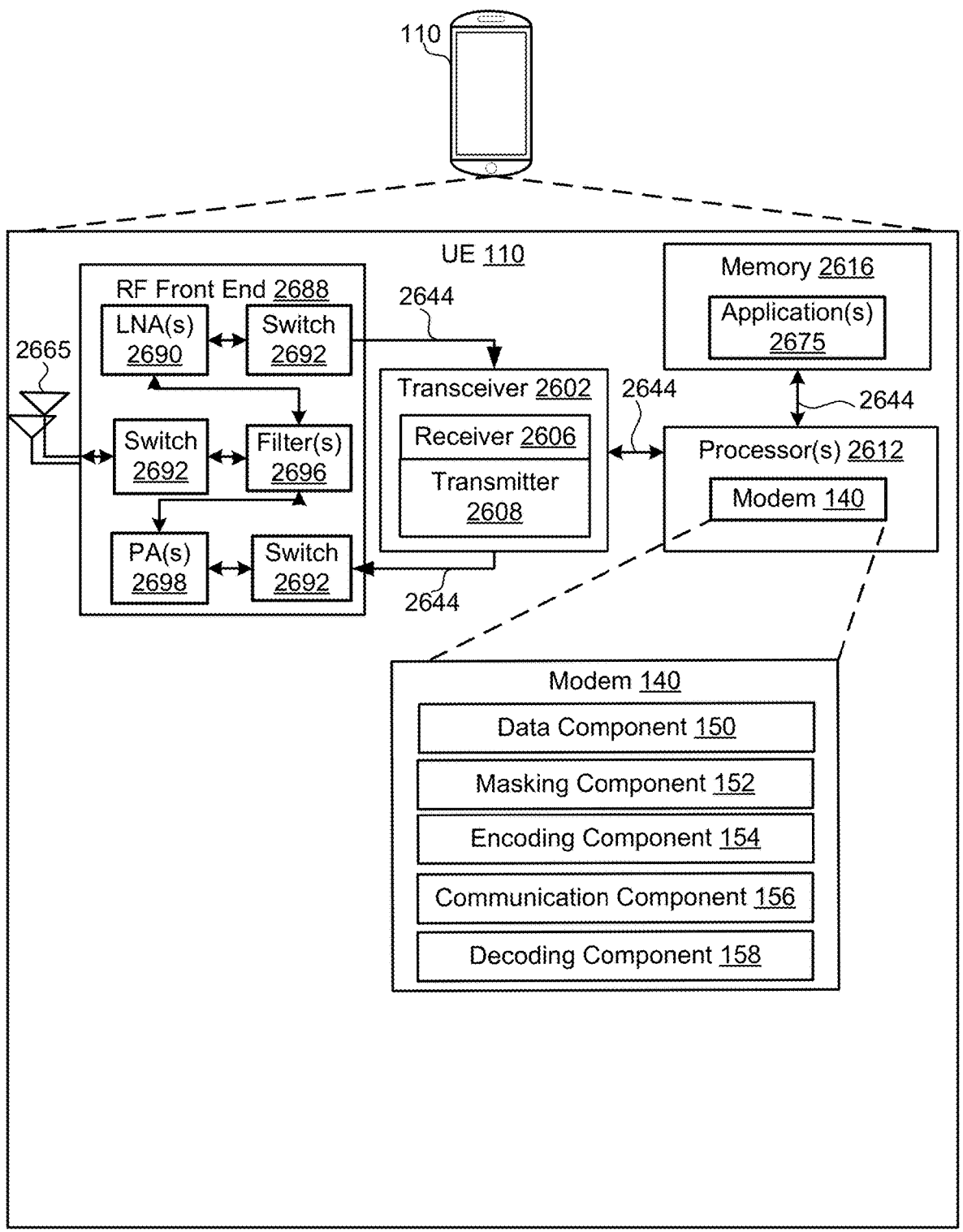
FIG. 26 is a schematic diagram of an example of a user equipment as described herein.

Referring to FIG. 26, one example of an implementation of the UE 110 may include a variety of components, some of which have already been described above, but including components such as one or more processors 2612 and memory 2616 executing one or more functions relating to polar encoding and decoding, and transceiver 2602 in communication via one or more buses 2644, which may operate in conjunction with modem 140 and the communication component 150 to enable one or more of the functions described herein related to controlling data packet transmission reliability. Further, the one or more processors 2612, modem 140, memory 2616, transceiver 2602, RF front end 2688 and the antenna system 2665, may be configured to support voice and/or data calls (simultaneously or non-simultaneously) in one or more radio access technologies.

In an aspect, the one or more processors 2612 may include a modem 140 that uses one or more modem processors. The various functions related to the communication component 150 may be included in modem 140 and/or processors 2612 and, in an aspect, may be executed by a single processor, while in other aspects, different ones of the functions may be executed by a combination of two or more different processors. For example, in an aspect, the one or more processors 2612 may include any one or any combination of a modem processor, or a baseband processor, or a digital signal processor, or a transmit processor, or a receiver processor, or a transceiver processor associated with transceiver 2602. In other aspects, some of the features of the one or more processors 2612 and/or modem 140 associated with the data component 150 may be performed by transceiver 2602.

Memory 2616 may include any type of computer-readable medium usable by a computer or at least one processor 2612, such as random access memory (RAM), read only memory (ROM), tapes, magnetic discs, optical discs, volatile memory, non-volatile memory, and any combination thereof. In an aspect, for example, memory 2616 may be a non-transitory computer-readable storage medium that stores one or more computer-executable codes defining communication component 156 and/or one or more of its subcomponents, and/or data associated therewith, when UE 110 is operating at least one processor 2612 to execute the communication component 156 and/or one or more of its subcomponents.

Transceiver 2602 may include at least one receiver 2606 and at least one transmitter 2608. Receiver 2606 may include hardware, firmware, and/or software code executable by a processor for receiving data, the code comprising instructions and being stored in a memory (e.g., computer-readable medium). Receiver 2606 may be, for example, a radio frequency (RF) receiver. In an aspect, receiver 2606 may receive signals transmitted by at least one base station 105. Additionally, receiver 2606 may process such received signals, and also may obtain measurements of the signals, such as, but not limited to, Ec/Io, SNR, RSRP, RSSI, etc. Transmitter 2608 may include hardware, firmware, and/or software code executable by a processor for transmitting data, the code comprising instructions and being stored in a memory (e.g., computer-readable medium). A suitable example of transmitter 2608 may including, but is not limited to, an RF transmitter.

Moreover, in an aspect, the UE 110 may include RF front end 2688, which may operate in communication with the antenna system 2665 and transceiver 2602 for receiving and transmitting radio transmissions, for example, wireless communications transmitted by at least one BS 105 or wireless transmissions transmitted by other BS 105 and UE 110. RF front end 2688 may be connected to the antenna system 2665 and may include one or more low-noise amplifiers (LNAs) 2690, one or more switches 2692, one or more power amplifiers (PAs) 2698, and one or more filters 2696 for transmitting and receiving RF signals.

In an aspect, LNA 2690 may amplify a received signal at a desired output level. In an aspect, each LNA 2690 may have a specified minimum and maximum gain values. In an aspect, RF front end 2688 may use one or more switches 2692 to select a particular LNA 2690 and its specified gain value based on a desired gain value for a particular application.

Further, for example, one or more PA(s) 2698 may be used by RF front end 2688 to amplify a signal for an RF output at a desired output power level. In an aspect, each PA 2698 may have specified minimum and maximum gain values. In an aspect, RF front end 2688 may use one or more switches 2692 to select a particular PA 2698 and its specified gain value based on a desired gain value for a particular application.

Also, for example, one or more filters 2696 may be used by RF front end 2688 to filter a received signal to obtain an input RF signal. Similarly, in an aspect, for example, a respective filter 2696 may be used to filter an output from a respective PA 2698 to produce an output signal for transmission. In an aspect, each filter 2696 may be connected to a specific LNA 2690 and/or PA 2698. In an aspect, RF front end 2688 may use one or more switches 2692 to select a transmit or receive path using a specified filter 2696, LNA 2690, and/or PA 2698, based on a configuration as specified by the transceiver 2602 and/or processor 2612.

As such, the transceiver 2602 may be configured to transmit and receive wireless signals through the antenna system 2665 via RF front end 2688. In an aspect, transceiver may be tuned to operate at specified frequencies such that UE 110 may communicate with, for example, one or more BSs 105 or one or more cells associated with one or more base stations 105. In an aspect, for example, modem 140 may configure the transceiver 2602 to operate at a specified frequency and power level based on the BS configuration of the UE 110 and the communication protocol used by modem 140.

In an aspect, modem 140 may be a multiband-multimode modem, which may process digital data and communicate with transceiver 2602 such that the digital data is sent and received using transceiver 2602. In an aspect, modem 140 may be multiband and be configured to support multiple frequency bands for a specific communications protocol. In an aspect, modem 140 may be multimode and be configured to support multiple operating networks and communications protocols. In an aspect, modem 140 may control one or more components of UE 110 (e.g., RF front end 2688, transceiver 2602) to enable transmission and/or reception of signals from the network based on a specified modem configuration. In an aspect, the modem configuration may be based on the mode of the modem and the frequency band in use. In another aspect, the modem configuration may be based on BS configuration information associated with UE 110 as provided by the network.

Figure 27:
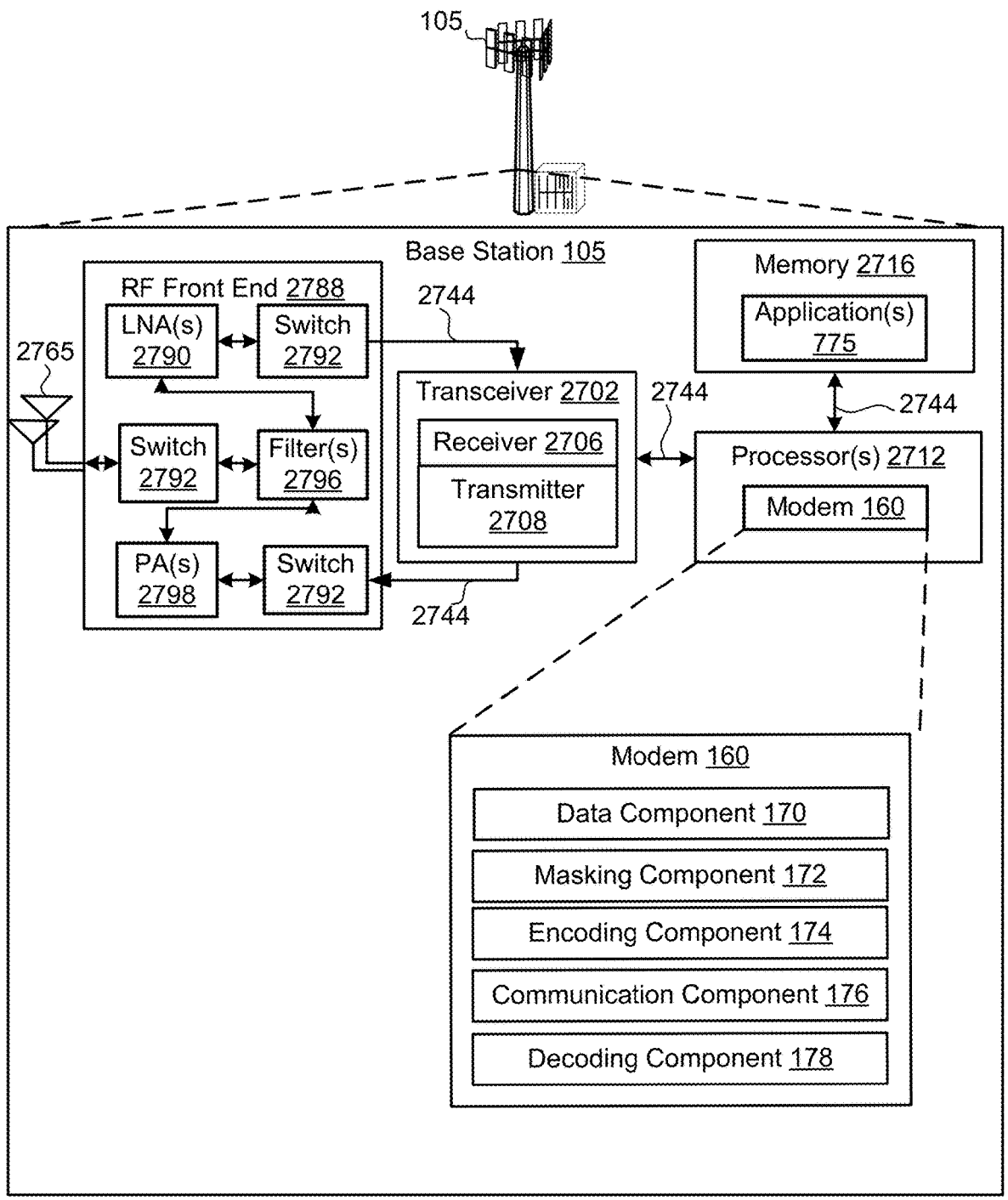
FIG. 27 is a schematic diagram of an example of a base station (BS) as described herein.

Referring to FIG. 27, one example of an implementation of the BS 105 may include a variety of components, some of which may be similar to the UE components already described above in connection with FIG. 26, but including components such as one or more processors 2712 and memory 2716, e.g., executing one or more functions relating to polar encoding and decoding, and transceiver 2702 in communication via one or more buses 2744, which may operate in conjunction with modem 160 and the communication component 176 to enable one or more of the functions described herein.

Figure 28:
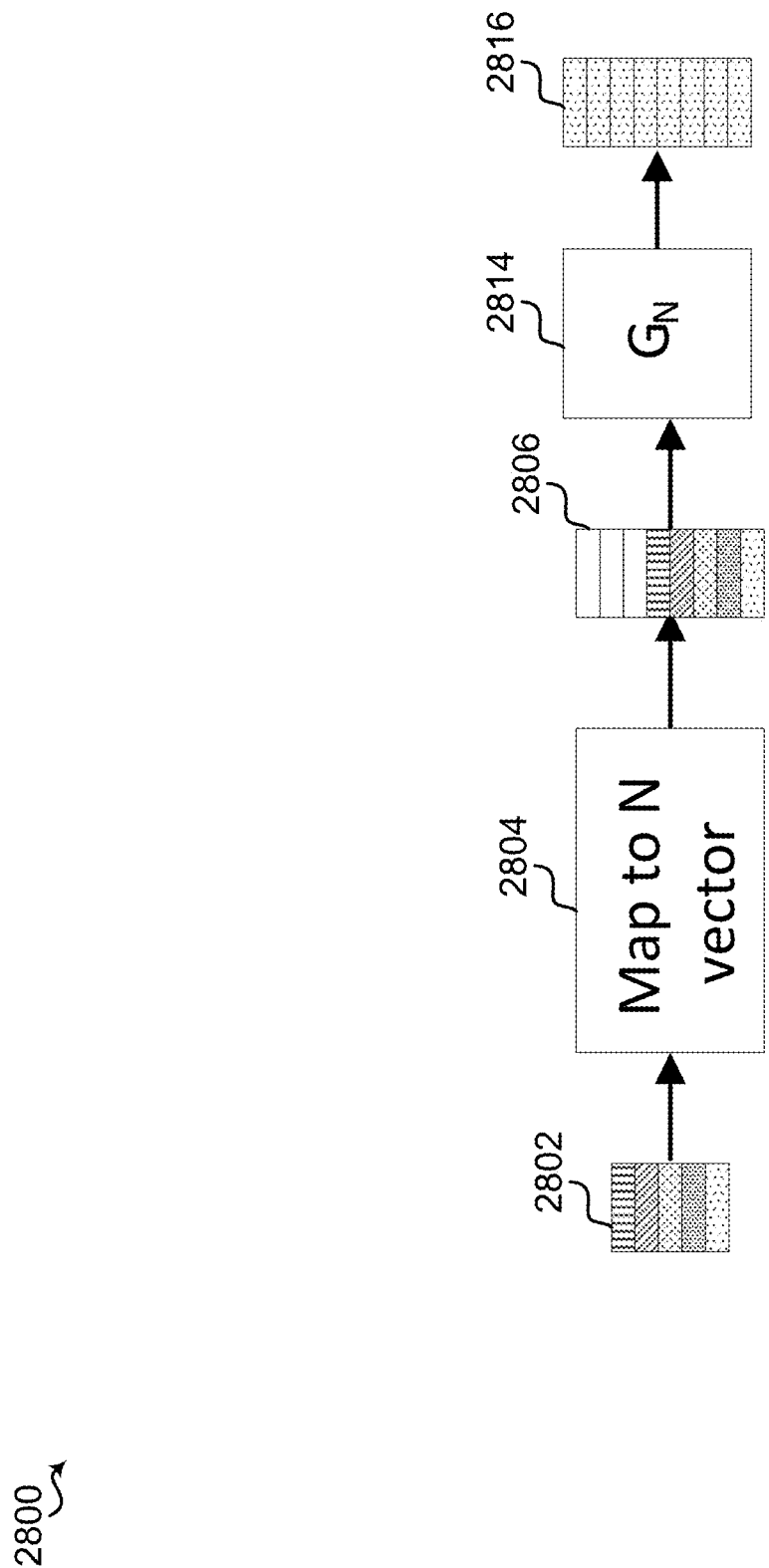
FIG. 28 is an example of a block diagram of polar encoding.

FIG. 28 shows an example of a block diagram 2800 of polar encoding. A data vector 2802 may include a number of data bits. By transforming the data vector 2802 with a mapping matrix 2804, the data vector 2802 is transformed to a u-domain vector 2806. The u-domain vector 2806 may include more bits than the data vector 2802. The u-domain vector 2806 may be transformed to a transmission vector 2816 by a polar encoding matrix 2814. The polar encoding matrix 2814 may perform a polar encoding transformation. The transmission vector 2816 may be sent to a receiving device.

Figure 29:
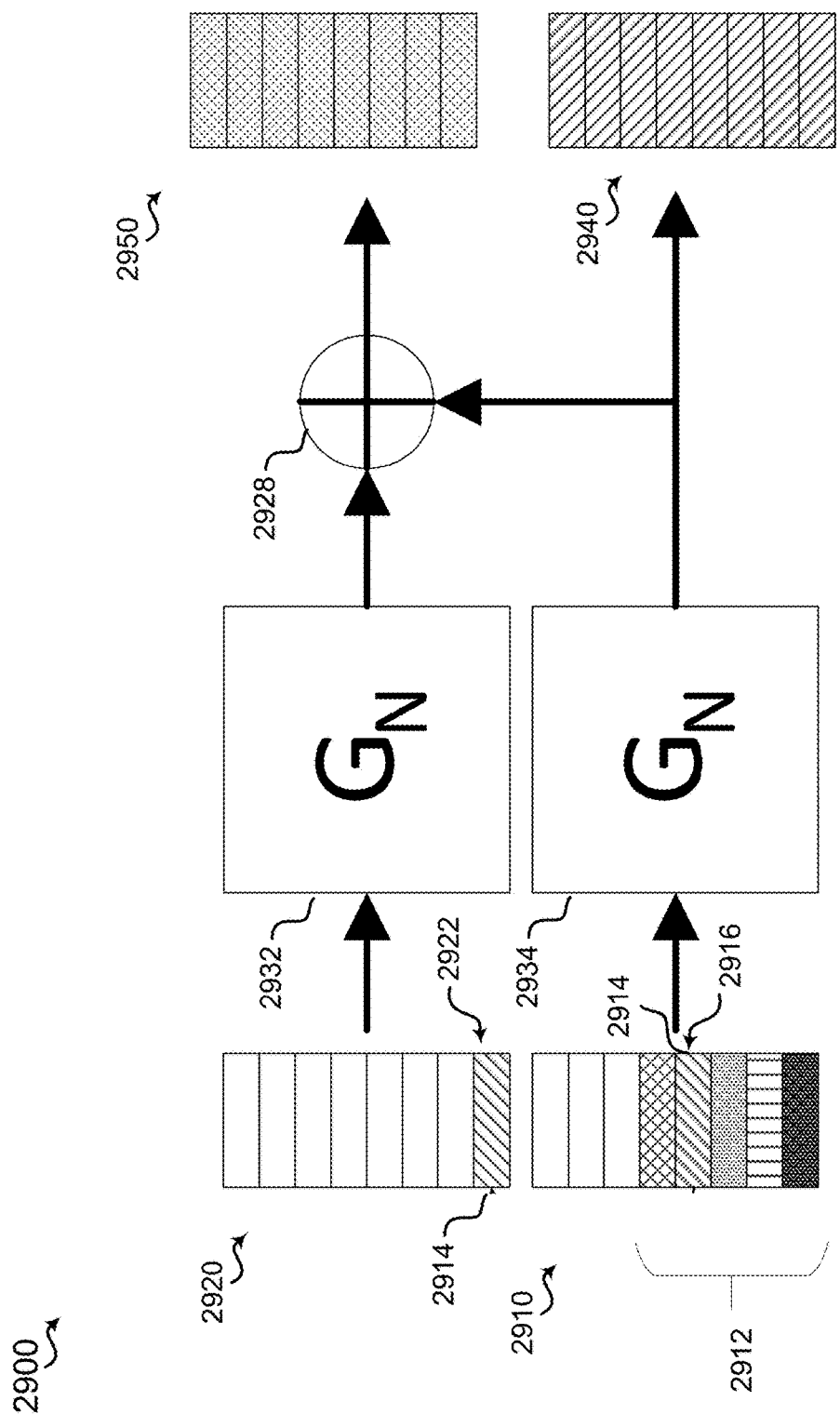
FIG. 29 is another example of a block diagram for active bit relocation for polar encoding with two transmissions.

FIG. 29 illustrates another example of a block diagram 2900 for active bit relocation for polar encoding with two transmissions. The block diagram 2900 may be equivalent to the block diagram 900. During the first transmission, a u-domain vector 2910 is transformed by a polar encoding matrix 2934 into a transmission vector 2940. The u-domain vector 2910 may include one or more data bits 2912, a repeated bit 2914 in an unreliable transmission location 2916. After the transmission of the transmission vector 2940, a second transmission may be initiated due to the failed decoding of the repeated bit 2914. During the second transmission, a u-domain vector 2920 may include the repeated bit 2914 at a reliable transmission location 2922. The transformed (by a polar encoding matrix 2932) u-domain vector 2920 may be bit-wised added 2928 with the transmission vector 2940 to form an transmission vector 2950. The repeated bit 2914 may be relocated to the reliable transmission location 2922 having a higher transmission reliability than the unreliable transmission location 2916. For example, the unreliable transmission location 2916 may be a resource location where information transmitted has a low probability (e.g. 50% for every transmission) of being decoded by receiving device. The reliable transmission location 2922 may be a different resource location where information transmitted has a high probability (e.g. 90% for every transmission) of being decoded by receiving device. At the receiving device, the transmission vector 2950 may be decoded before the transmission vector 2940.

Figure 30:
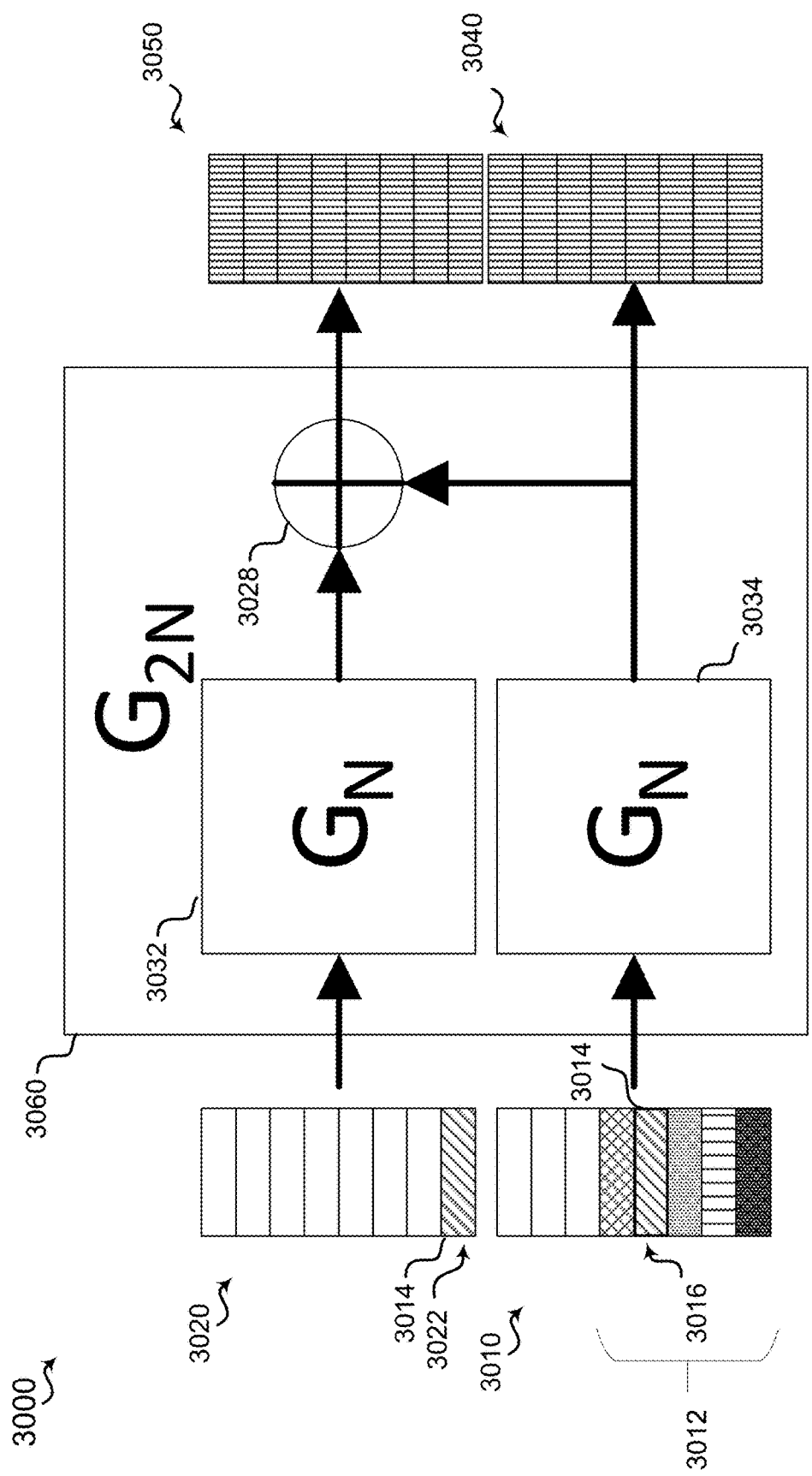
FIG. 30 is yet another example of a block diagram for active bit relocation for polar encoding with two transmissions.

FIG. 30 illustrates yet another example of a block diagram 3000 for active bit relocation for polar encoding with two transmissions. The block diagram 3000 may also be equivalent to the block diagram 900. During the first transmission, a u-domain vector 3010 is transformed by a polar encoding matrix 3034 into a transmission vector 3040. The u-domain vector 3010 may include one or more data bits 3012, a repeated bit 3014 in an unreliable transmission location 3016. After the transmission of the transmission vector 3040, a second transmission may be initiated due to the failed decoding of the repeated bit 3014. During the second transmission, a u-domain vector 3020 may include the repeated bit 3014 at a reliable transmission location 3022. The transformed (by a polar encoding matrix 3032) u-domain vector 3020 may be bit-wised added by an adder 3028 with the transmission vector 3040 to form an transmission vector 3050. The repeated bit 3014 may be relocated to the reliable transmission location 3022 having a higher transmission reliability than the unreliable transmission location 3016. For example, the unreliable transmission location 3016 may be a resource location where information transmitted has a low probability (e.g. 20% for every transmission) of being decoded by receiving device. The reliable transmission location 3022 may be a different resource location where information transmitted has a high probability (e.g. 95% for every transmission) of being decoded by receiving device. At the receiving device, the transmission vector 3050 may be decoded before the transmission vector 3040. In some implementations, the polar encoding matrices 3032, 3034 and the adder 3028 may be implemented by an equivalent polar encoding matrix 3060.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a web site, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method of transmitting data to a receiving device, comprising:
    constructing a data vector including a plurality of data bits;
    transforming the data vector into a u-domain vector;
    applying a mask to the u-domain vector;
    encoding the masked u-domain vector with a polar encoding to generate a transmission vector;
    transmitting, to the receiving device, the transmission vector;
    receiving an indication that the receiving device failed to decode the data bits, wherein the data bits include a first portion that is in a reliable transmission location and a second portion that is in an unreliable transmission location;
    constructing a redundant data vector including the second portion of the data bits by relocating the second portion of the data bits from the unreliable transmission location to the reliable transmission location;
    transforming the redundant data vector into a redundant u-domain vector;
    masking the redundant u-domain data vector with a redundant mask;
    encoding the masked redundant u-domain vector with the polar encoding to generate a redundant transmission vector; and
    transmitting, to the receiving device, the redundant transmission vector.

2. The method of claim 1, wherein the redundant mask includes the u-domain vector.

3. The method of claim 1, wherein the data vector further includes one or more first cyclic redundancy check (CRC) bits and the redundant data vector includes one or more second CRC bits.

4. The method of claim 1, wherein transforming the data vector into the u-domain vector includes converting a portion of bits in the u-domain vector into frozen bits.

5. A user equipment, comprising:
    a memory;
    a transceiver; and
    a processor in communication with the memory and the transceiver and configured to:
        construct a data vector including a plurality of data bits;
        transform the data vector into a u-domain vector;
        applying a mask to the u-domain vector;
        encode the masked u-domain vector with polar encoding to generate a transmission vector;
        transmit, to a receiving device via the transceiver, the transmission vector;
        receive an indication that the receiving device failed to decode the data bits, wherein the data bits include a first portion that is in a reliable transmission location and a second portion that is in an unreliable transmission location;
        construct a redundant data vector including the second portion of the data bits by relocating the second portion of the data bits from the unreliable transmission location to the reliable transmission location;
        transform the redundant data vector into a redundant u-domain vector;
        mask the redundant u-domain data vector with a redundant mask;
        encode the masked redundant u-domain vector with the polar encoding to generate a redundant transmission vector; and
        transmit, to the receiving device via the transceiver, the redundant transmission vector.

6. The user equipment of claim 5, wherein the redundant mask includes the u-domain vector.

7. The user equipment of claim 5, wherein the data vector further includes one or more first cyclic redundancy check (CRC) bits and the redundant data vector includes one or more second CRC bits.

8. The user equipment of claim 5, wherein transforming the data vector into the u-domain vector includes converting a portion of bits in the u-domain vector into frozen bits.

9. A non-transitory computer-readable medium having instructions stored therein that, when executed by one or more processors, cause the one or more processors to:
construct a data vector including a plurality of data bits;
transform the data vector into a u-domain vector;
apply a mask to the u-domain vector;
encode the masked u-domain vector with polar encoding to generate a transmission vector;
transmit, to a receiving device, the transmission vector;
receive an indication that the receiving device failed to decode the data bits, wherein the data bits include a first portion that is in a reliable transmission location and a second portion that is in an unreliable transmission location;
construct a redundant data vector including the second portion of the data bits by relocating the second portion of the data bits from the unreliable transmission location to the reliable transmission location;
transform the redundant data vector into a redundant u-domain vector;
mask the redundant u-domain data vector with a redundant mask;
encode the masked redundant u-domain vector with the polar encoding to generate a redundant transmission vector; and
transmit, to the receiving device, the redundant transmission vector.

10. The non-transitory computer-readable medium of claim 9, wherein the redundant mask includes the u-domain vector.

11. The non-transitory computer-readable medium of claim 9, wherein the data vector further includes one or more first cyclic redundancy check (CRC) bits and the redundant data vector includes one or more second CRC bits.

12. The non-transitory computer-readable medium of claim 9, wherein transforming the data vector into the u-domain vector includes converting a portion of bits in the u-domain vector into frozen bits.

13. A method of retransmitting data, comprising:
generating a first data vector having a plurality of data bits;
generating a first u-domain vector by transforming the first data vector, wherein the first u-domain vector includes first active bits and first non-active bits;
encoding the first u-domain vector with a polar encoder to generate a first transmission vector having a first plurality of bits and a second plurality of bits;
transmitting the first plurality of bits;
receiving an indication of a failed decoding of the first plurality of bits;
in response to the indication of the failed decoding:
generating a second data vector having a portion of the plurality of data bits;
generating a mask based on the first data vector;
generating a second u-domain vector by transforming the second data vector, wherein the second u-domain vector includes second active bits and second non-active bits;
applying a mask to the second u-domain vector to generate an intermediate vector;
encoding the intermediate vector with the polar encoder to generate a second transmission vector having a third plurality of bits and a fourth plurality of bits; and
transmitting the third plurality of bits.

14. The method of claim 13, wherein:
the first non-active bits and the second non-active bits include frozen bits; and
the first plurality of bits and the third plurality of bits are identical.

15. The method of claim 13, wherein:
the first non-active bits and the second non-active bits include frozen bits; and
the second plurality of bits and the fourth plurality of bits are not transmitted.

16. The method of claim 13, wherein:
the first non-active bits and the second non-active bits include frozen bits; and
the second plurality of bits and the fourth plurality of bits are zero-valued.

17. The method of claim 13, wherein:
the first non-active bits include frozen bits or zero-valued bits; and
the first plurality of bits and the third plurality of bits are identical.

18. The method of claim 13, wherein:
the first non-active bits include frozen bits or zero-valued bits; and
the second plurality of bits and the fourth plurality of bits are not transmitted.

19. The method of claim 13, wherein:
the first non-active bits and the second non-active bits include frozen bits or zero-valued bits; and
the second plurality of bits and the fourth plurality of bits are zero-valued.

20. The method of claim 13, wherein a length of the first transmission vector is identical to a length of the second transmission vector.

21. The method of claim 13, wherein a length of the first transmission vector is longer than a length of the second transmission vector.

22. The method of claim 13, wherein a length of the first transmission vector is shorter than a length of the second transmission vector.

23. The method of claim 13, wherein:
the second plurality of bits and the fourth plurality of bits are zero-valued; and
a number of the second plurality of bits is the same to a number of the fourth plurality of bits.

24. The method of claim 13, wherein:
the second plurality of bits and the fourth plurality of bits are zero-valued; and
a number of the second plurality of bits is longer than a number of the fourth plurality of bits.

* * * * *